United States Patent
Lee et al.

(10) Patent No.: US 8,872,256 B2
(45) Date of Patent: Oct. 28, 2014

(54) THREE-DIMENSIONAL SEMICONDUCTOR MEMORY DEVICES AND METHODS OF FABRICATING THE SAME

(71) Applicant: Samsung Electronics Co., Ltd., Gyeonggi-do (KR)

(72) Inventors: Juyul Lee, Hwaseong-si (KR); Bumsu Kim, Seongnam-si (KR); Kwangmin Park, Seoul (KR); Hyun Park, Hwaseong-si (KR); Jae-Young Ahn, Seongnam-si (KR); Dongchul Yoo, Seongnam-si (KR); Jongsik Chun, Hwaseong-si (KR); Kihyun Hwang, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 13/796,118

(22) Filed: Mar. 12, 2013

(65) Prior Publication Data
US 2013/0270643 A1     Oct. 17, 2013

(30) Foreign Application Priority Data
Apr. 16, 2012   (KR) .................. 10-2012-0039151

(51) Int. Cl.
*H01L 27/105*     (2006.01)

(52) U.S. Cl.
CPC .................... *H01L 27/1052* (2013.01)
USPC ........................... 257/326; 438/266

(58) Field of Classification Search
USPC ................. 257/314–326; 438/257–267
See application file for complete search history.

(56) References Cited

U.S. PATENT DOCUMENTS

| | | | |
|---|---|---|---|
| 8,283,228 B2 * | 10/2012 | Alsmeier | 438/257 |
| 2005/0247973 A1 | 11/2005 | Lee | |
| 2010/0163968 A1 * | 7/2010 | Kim et al. | 257/324 |
| 2011/0147824 A1 | 6/2011 | Son et al. | |
| 2011/0233648 A1 | 9/2011 | Seol et al. | |
| 2012/0049268 A1 * | 3/2012 | Chang et al. | 257/324 |

FOREIGN PATENT DOCUMENTS

| | | |
|---|---|---|
| JP | 06-005871 | 1/1994 |
| JP | 2005-191057 | 7/2005 |
| KR | 1020040022490 | 3/2004 |
| KR | 1020040022491 | 3/2004 |
| KR | 1020050043207 | 5/2005 |
| KR | 1020050108145 | 11/2005 |
| KR | 1020060062554 | 6/2006 |
| KR | 1020100060893 | 6/2010 |
| KR | 1020110001589 | 1/2011 |
| KR | 1020110108228 | 10/2011 |
| KR | 1020110119156 | 11/2011 |

* cited by examiner

*Primary Examiner* — Daniel Shook
(74) *Attorney, Agent, or Firm* — F. Chau & Associates, LLC

(57) ABSTRACT

A three-dimensional (3D) semiconductor memory device includes an electrode separation pattern, a stack structure, a data storage layer, and a channel structure. The electrode separation pattern is disposed on a substrate. A stack structure is disposed on a sidewall of the electrode separation pattern. The stack structure includes a corrugated sidewall opposite to the sidewall of the electrode separation pattern. The sidewall of the electrode separation pattern is vertical to the substrate. A data storage layer is disposed on the corrugated sidewall. A channel structure is disposed on the charge storage layer.

10 Claims, 32 Drawing Sheets

THREE-DIMENSIONAL SEMICONDUCTOR MEMORY DEVICES AND METHODS OF FABRICATING THE SAME

CROSS-REFERENCE TO RELATED APPLICATION

This application claims priority under 35 U.S.C. §119 to Korean Patent Application No. 10-2012-0039151, filed on Apr. 16, 2012, in the Korean Intellectual Property Office, the disclosure of which is incorporated by reference herein in its entirety.

TECHNICAL FIELD

The inventive concept relates to semiconductor devices and methods of fabricating the same and, more particularly, to three-dimensional (3D) semiconductor memory devices and methods of fabricating the same.

DESCRIPTION OF THE RELATED ART

Semiconductor devices have been highly integrated to provide consumers high end electronic device at an affordable price. A degree of integration has been an important factor in determining product prices, so high integration processes are desired in light of costs. For planar semiconductor memory devices, a degree of integration is primarily determined by a unit memory cell size. Accordingly, such degree of integration is greatly influenced by the level of fine patterning technology used in manufacturing such memory devices. However, the costs of such fine patterning technology set a practical limitation on integration of planar semiconductor devices in high density.

To overcome such a limitation, three-dimensional semiconductor memory devices have been proposed. Three-dimensional semiconductor memory devices may include memory cells arranged in three dimensions. However, such three dimensional structure demands new process technologies to reduce manufacturing costs and increase reliability.

SUMMARY

According to an exemplary embodiment of the inventive concept, a three-dimensional (3D) semiconductor memory device includes a stack structure, a channel structure, and a data storage layer. The stack structure includes a plurality of gate patterns and a plurality of insulating patterns which are stacked alternately and vertically on a substrate. The stack structure has a sidewall with a plurality of enlarged regions recessed laterally. The channel structure is adjacent to the sidewall of the stack structure and is connected to the substrate. The data storage layer is disposed between the stack structure and the channel structure and covers the sidewall of the stack structure.

According to an exemplary embodiment of the inventive concept, to fabricate a three-dimensional (3D) semiconductor memory device, a thin-layered structure including a plurality of first material layers and a plurality of second material layers is stacked alternately and vertically on a substrate. An opening is formed in the thin-layered structure. The opening penetrates the thin-layered structure so that the thin-layered structure includes a sidewall defined by the opening. The opening exposes the substrate as well. The plurality of first material layers patterned by the opening are laterally recessed to a first distance from the opening so that the sidewall includes a plurality of enlarged regions between the plurality of second material layers patterned by the opening. A data storage layer is formed on the sidewall including the plurality of enlarged regions. A channel structure is formed on the data storage layer and the exposed substrate.

According to an exemplary embodiment of the inventive concept, a three-dimensional (3D) semiconductor memory device includes an electrode separation pattern, a stack structure, a data storage layer, and a channel structure. The electrode separation pattern is disposed on a substrate. A stack structure is disposed on a sidewall of the electrode separation pattern. The stack structure includes a corrugated sidewall opposite to the sidewall of the electrode separation pattern. The sidewall of the electrode separation pattern is vertical to the substrate. A data storage layer is disposed on the corrugated sidewall. A channel structure is disposed on the charge storage layer.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
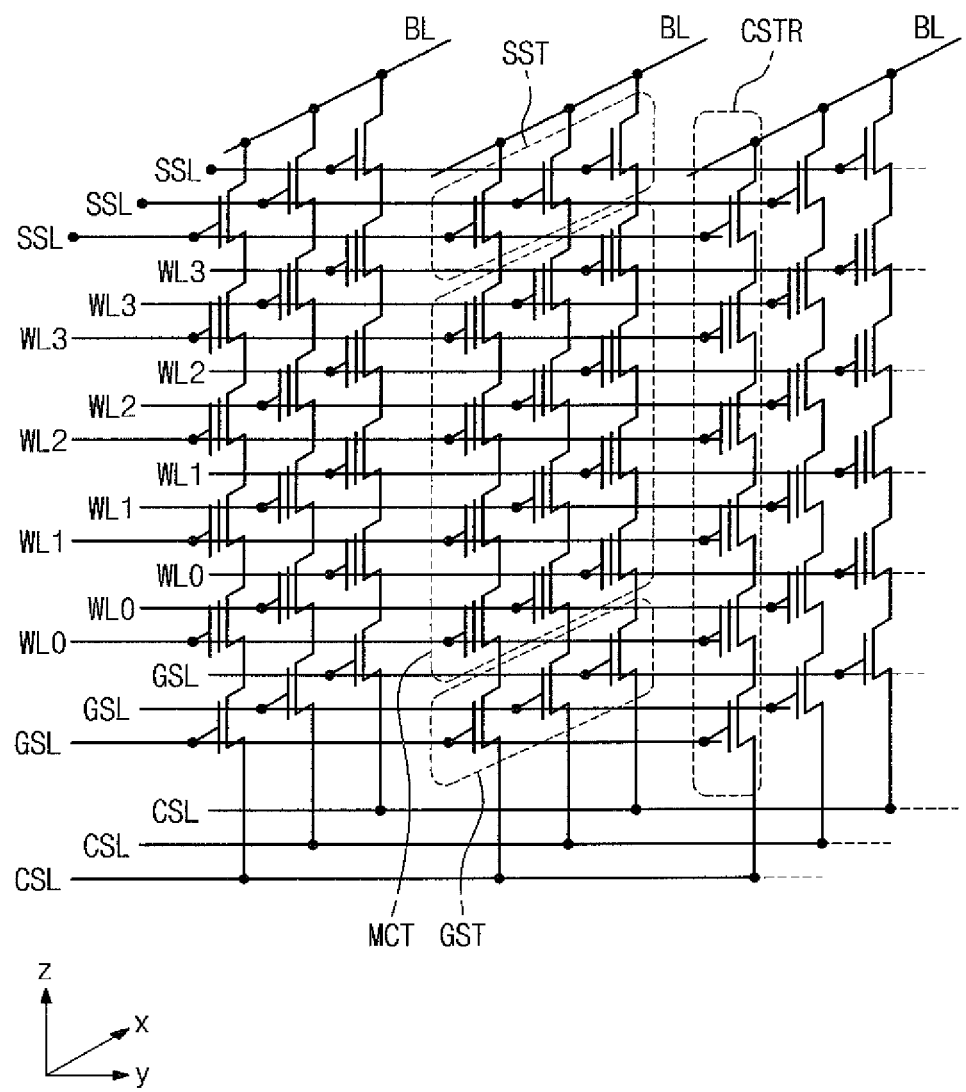
FIG. 1 is a schematic circuit diagram illustrating a three dimensional (3D) semiconductor memory device according to an exemplary embodiment of the inventive concept.

Exemplary embodiments of the inventive concept will be described below in more detail with reference to the accompanying drawings. However, the inventive concept may be embodied in different forms and should not be construed as limited to the embodiments set forth herein. Rather, these exemplary embodiments are provided so that this disclosure will be thorough and complete and will fully convey the inventive concept to those skilled in the art. In the drawings, the thickness of layers and regions may be exaggerated for clarity. Like reference numerals may refer to the like elements throughout the specification and drawings.

Hereinafter, 3D semiconductor memory devices and methods of fabricating the same according to an exemplary embodiment of the inventive concept will be described with reference to the drawings in more detail.

FIG. 1 is a schematic circuit diagram illustrating a three dimensional (3D) semiconductor memory device according to an exemplary embodiment of the inventive concept.

Referring to FIG. 1, a cell array a 3D semiconductor memory device according to an exemplary embodiment may include a common source line CSL, a plurality of bit lines BL, and a plurality of cell strings CSTR disposed between the common source line CSL and the bit lines BL.

The bit lines BL may be two-dimensionally arranged. A plurality of cell strings CSTR may be connected in parallel to each of the bit lines BL. The cell strings CSTR may be connected in common to the common source line CSL. For example, a plurality of cell strings CSTR may be disposed between the common source line CSL and the plurality of bit lines BL. In an exemplary embodiment of the inventive concept, the common source line CSL may be provided in plural, and the plurality of common source lines CSL may be two-dimensionally arranged. A common voltage may be applied to the common source lines CSL. Alternatively, the common source lines CSL may be electrically controlled independently from each other.

Each of the cell strings CSTR may include a ground selection transistor GST connected to the common source line CSL, a string selection transistor SST connected to the bit line BL, and a plurality of memory cell transistors MCT disposed between the ground and string selection transistors GST and SST. The ground selection transistor GST, the memory cell transistors MCT, and the string selection transistor SST may be connected in series to each other.

The common source line CSL may be connected in common to sources of the ground selection transistors GST. A ground selection GSL, a plurality of word lines WL0 to WL3, and a plurality of string selection lines SSL, which are disposed between the common source line CSL and the bit lines BL, may be used as gate electrodes of the ground selection transistor GST, the memory cell transistors MCT, and the string selection transistors SST, respectively. Each of the memory cell transistors MCT includes a data storage element.

Figure 2:
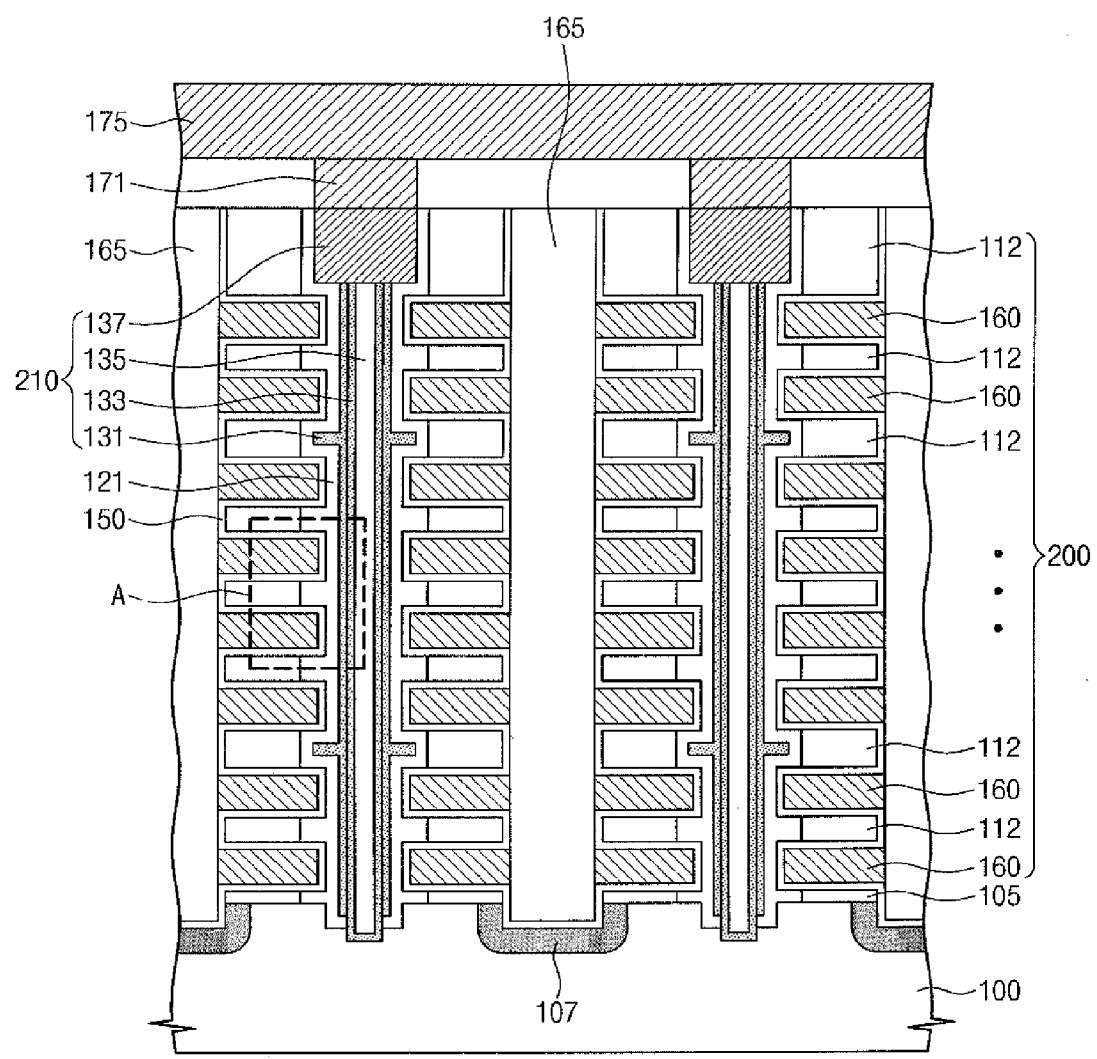
FIG. 2 is a cross-sectional view illustrating a 3D semiconductor memory device according to an exemplary embodiment of the inventive concept.

FIG. 2 is a cross-sectional view illustrating a 3D semiconductor memory device according to an exemplary embodiment of the inventive concept. FIGS. 3A to 3F are enlarged views of portion A of FIG. 2.

Referring to FIG. 2, a stack structure 200 may be disposed on a substrate 100. The stack structure 200 includes insulating patterns 112 and gate patterns 160 which are alternately and repeatedly stacked on the substrate 100.

The substrate 100 may be a silicon substrate, a germanium substrate, or a silicon-germanium substrate. The substrate 100 may include a common source region 107 doped with dopants.

The stack structure 200 may have a three-dimensional structure that gate patterns 160 and insulating patterns 112 are stacked in a first direction perpendicular to the substrate 100. The stack structure 200 may be disposed on a sidewall of an electrode separation pattern 165 and include a corrugated sidewall. In an exemplary embodiment of the inventive concept, each of the gate patterns 160 may have a width extended in a second direction perpendicular to the first direction and may protrude between the insulating patterns 112. The width of each of the gate patterns 160 may be different from that of each of the insulating patterns 112 in the stack structure 200. For example, the width of the gate pattern 160 is greater than that of the insulating pattern 112. Thus, the stack structure 200 may have an inner sidewall having enlarged regions as shown in portion A. The inner sidewall is referred to as a corrugated sidewall where the enlarged regions A are repeated vertically. Each of the enlarged regions may be defined by the two neighboring gate patterns 160 and an insulating pattern 112. The insulating patterns 112 are each recessed between the two neighboring gate patterns 160 and are vertically spaced apart from each other by the gate patterns 160. In more detail, as illustrated in FIGS. 3A to 3F, the enlarged region 117 may be defined between the gate patterns 112 vertically adjacent to each other.

In an exemplary embodiment of the inventive concept, each of the gate patterns 160 may have a thickness in the first direction. The thickness of each of the gate patterns 160 may be different from that of each of the insulating patterns 112 in the stack structure 200. For example, the thickness of each of the insulating patterns 112 may be smaller than that of each of the gate patterns 160. In an exemplary embodiment of the inventive concept, the thickness of each of some of the insulating patterns 112 may be greater than that of the gate pattern 160. In an exemplary embodiment of the inventive concept, the thickness of the insulating pattern 112 may be substantially equal to that of the gate pattern 160.

In an exemplary embodiment of the inventive concept, the uppermost gate pattern of the gate patterns 160 may be used as the gate electrode of the string selection transistor SST of FIG. 1 controlling electrical connection between a bit line 175 and a channel structure 210. The lowermost gate pattern of the gate patterns 160 may be used as the gate electrode of the ground selection transistor GST of FIG. 1 controlling electrical connection between a dopant region 107 (i.e., the common source line) formed in the substrate 100 and the channel structure 210 in a 3D NAND flash memory device.

In an exemplary embodiment of the inventive concept of the inventive concept, the stack structure 200 may be formed on a lower insulating layer 105. The lower insulating layer 105 may be formed between the substrate 100 and the stack structure 200. For example, the lower insulating layer 105 may be formed of a silicon oxide layer by a thermal oxidation process. In an exemplary embodiment of the inventive concept, the lower insulating layer 105 may be formed of a silicon oxide layer by a deposition technique. The lower insulating layer 105 may have a thickness smaller than that of each of the insulating patterns 112 formed on the lower insulating layer 105.

In an exemplary embodiment of the inventive concept of the inventive concept, the channel structure 210 may penetrate the stack structure 200 and may be electrically connected to the substrate 100. The channel structure 210 may penetrate a plurality of the gate patterns 160 sequentially stacked on the substrate 100. In an exemplary embodiment of the inventive concept, the channel structure 210 may be formed of a semiconductor material. The channel structure 210 may have a conductive pad 137 disposed at a top end portion thereof. The conductive pad 137 may be a dopant region doped with dopants or may be formed of a conductive material. A bottom surface of the channel structure 210 may be disposed at a level lower than a top surface of the substrate 100. For example, a portion of the channel structure 210 may be formed in a recessed region of the substrate 100.

The channel structure 210 may constitute a column structure extended in the first direction in a plan view. In an exemplary embodiment of the inventive concept, the channel structures 210 penetrating the stack structure 200 may be arranged in zigzag form along the one direction in a plan view.

In an exemplary embodiment of the inventive concept, the channel structure 210 may have a filling insulating pattern 135 inside. In an exemplary embodiment of the inventive concept, the channel structure 210 may have the shape of a hollow pipe whose inner side is uneven.

The channel structure 210 may also include a first semiconductor pattern 131 and a second semiconductor pattern 133. The first semiconductor pattern 131 may be disposed on the inner sidewall of the stack structure 200 which has the enlarged regions 117 (See FIGS. 3A to 3F). The first semiconductor pattern 131 may have a shape of a hollow pipe with a top end and a bottom end that are open. The first semiconductor pattern 131 need not be in contact with the substrate 100. For example, the first semiconductor pattern 131 may be spaced apart from the substrate 100.

The second semiconductor pattern 133 may have a shape of a hollow pipe with a bottom end closed. The inside having the shape of the second semiconductor pattern 133 may be filled with the filling insulating pattern 135. The second semiconductor pattern 133 may be in contact with an inner sidewall of the first semiconductor pattern 131 and the substrate 100. For example, the second semiconductor pattern 133 may be electrically connected to the first semiconductor pattern 131 and the substrate 100.

The first and second semiconductor patterns 131 and 133 may be undoped. In an exemplary embodiment of the inventive concept, the first and second semiconductor patterns 131 and 133 may be doped with dopants of the same conductivity type as the substrate 100. The first and second semiconductor patterns 131 and 133 may be in a poly-crystalline state or a single-crystalline state.

In an exemplary embodiment of the inventive concept, a vertical insulator 121 may be disposed between the stack structure 200 and the channel structure 210. The vertical insulator 121 may have a shape of a hollow pipe whose top and bottom ends are open. In an exemplary embodiment of the inventive concept, the vertical insulator 121 may include a bottom portion disposed between a bottom surface of the first semiconductor pattern 131 and the substrate 100. Additionally, the vertical insulator 121 may have a shape which is substantially vertical to the substrate 100 and is winding. The vertical insulator 121 may conformally cover the inner sidewall of the stack structure 200, filling the space between the gate patterns 160 protruded between the insulating patterns 112. For example, the vertical insulator 121 may have protrusions protruding in a direction horizontal to the top surface of the substrate 100.

In an exemplary embodiment of the inventive concept, the vertical insulator 121 includes a data storage layer (not shown). The data storage layer may include a charge storage layer of a flash memory device. For example, the charge storage layer may be a trap insulating layer or an insulating layer including conductive nano dots. Data stored in the data storage layer may be changed using Fowler-Nordheim tunneling caused by a voltage difference between the channel structure 210 and the gate patterns 160. In an exemplary embodiment of the inventive concept, the data storage layer may include a thin layer (e.g., a thin layer for a phase change memory device or a thin layer for a variable resistance memory device) which stores data based on another operation principle.

Additionally, a horizontal insulator 150 may be disposed between the stack structure 200 and the vertical insulator 121. The horizontal insulator 150 may substantially horizontally extend to cover a bottom surface and a top surface of the gate pattern 160. A horizontal insulator 150 may include one thin layer or a plurality of thin layers. In an exemplary embodiment of the inventive concept, the horizontal insulator 150 may include a blocking insulating layer (not shown) of a charge trap type flash memory transistor.

A bit line 175 may cross over the stack structure 200. The bit line 175 may be connected to the conductive pad 137 of the channel structure 210 through a contact plug 171.

Hereinafter, the vertical insulator according to an exemplary embodiment of the inventive concept of the inventive concept will be described with reference to FIGS. 3A to 3F in more detail.

According to exemplary embodiments described with reference to FIGS. 3A to 3F, the vertical insulator 121 may include a charge storage layer CTL, and the charge storage layer CTL may conformally cover the inner sidewall of the stack structure 200. In an exemplary embodiment of the inventive concept, the width of the insulating pattern 112 is smaller than that of the gate pattern 160, and the enlarged region 117 may be defined between the gate patterns 160 vertically adjacent to each other. For example, the stack structure 200 may have the inner sidewall which includes a plurality of the enlarged regions 117 vertically spaced apart from each other. Thus, the charge storage layer CTL may conformally cover inner surfaces of the enlarged regions 117 defined between the gate patterns 160. The charge storage layer CTL may have a thickness that is less than half of the thickness (e.g., a vertical distance between the gate patterns 160) of the insulating pattern 112. Thus, the charge storage layer CTL may be conformally disposed on the enlarged region 117 and an empty space may be defined in the enlarged region 117. For example, the charge storage layer CTL may have an uneven structure. Thus, since the uneven structure of the charge storage layer CTL may increase distance between charges trapped in the charge storage layer CTL and may suppress the trapped charges from spreading vertically in the charge storage layer CTL. As a result, a loss of charges stored in the date storage layer may be reduced, and charge retention characteristic of the 3D semiconductor memory device may be improved. It is also possible to reduce a data disturbance caused by the spread of the charges, and the 3D semiconductor memory device may have high reliability.

Figure 3A:
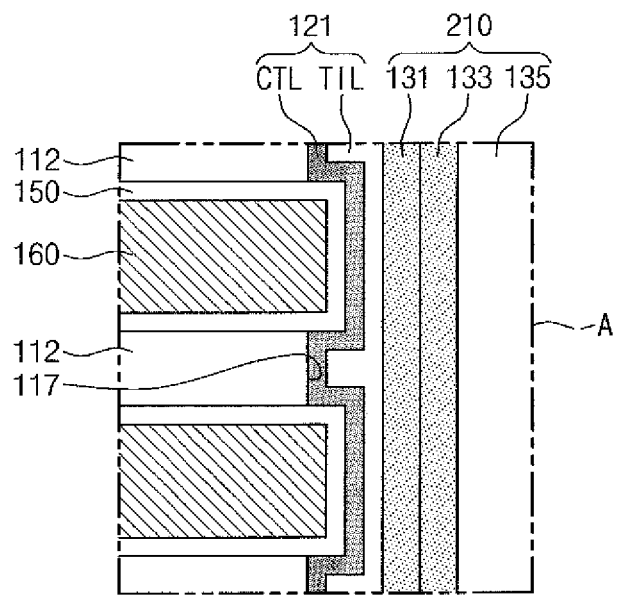
FIGS. 3A to 3F are enlarged views of portion A of FIG. 2.
Figure 3B:
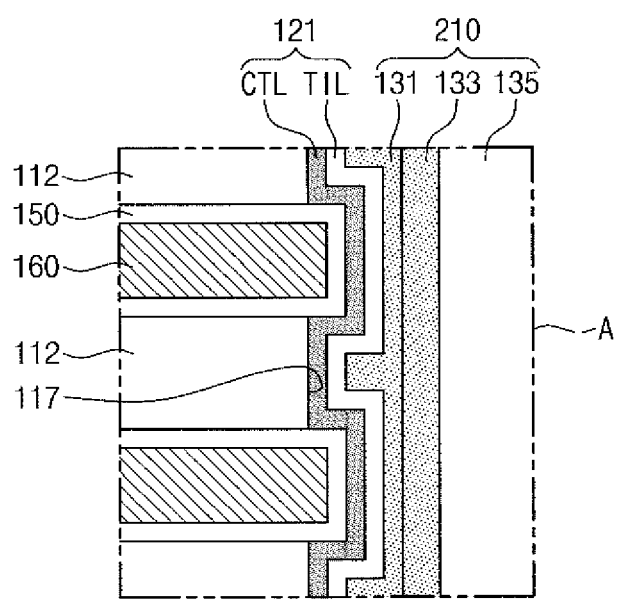
Figure 3C:
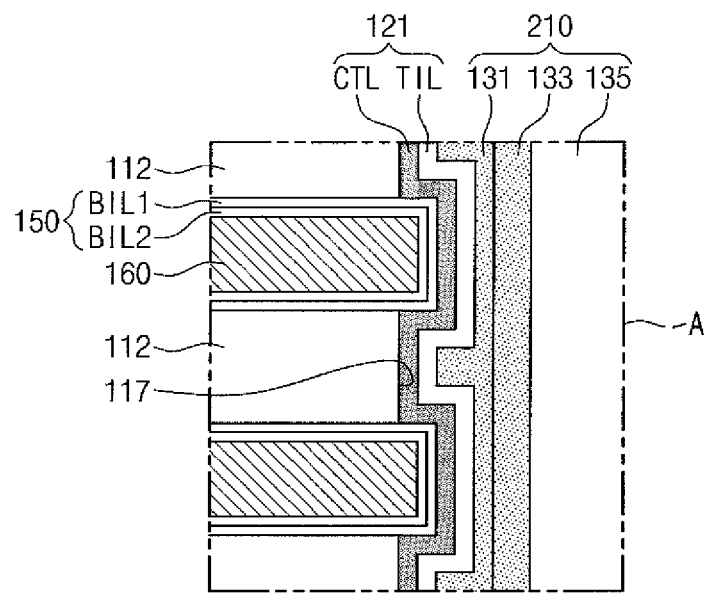

In more detail, as shown in FIGS. 3A to 3C, the vertical insulator 121 may include the charge storage layer CTL and a tunnel insulating layer TIL. The charge storage layer CTL may be disposed on the stack structure 200 including the gate patterns 160 and the insulating patterns 112. For example, the charge storage layer CTL may be disposed on the insulating patterns 112 between the protruded gate patterns 160. The charge storage layer CTL may be also disposed on the gate patterns 160. In an exemplary embodiment of the inventive concept, the horizontal insulator 150 may be disposed between the gate patterns 160 and the charge storage layer CTL and may be disposed between the gate patterns 160 and the insulating patterns 112.

In FIG. 3A, the tunnel insulating layer TIL may be conformally formed on the charge storage layer CTL and fill the empty space defined by the charge storage layer CTL. Thus, a thickness of the tunnel insulating layer TIL between the insulating pattern 112 and the channel structure 210 may be greater than that of the tunnel insulating layer TIL between the gate pattern 160 and the channel structure 210.

In FIG. 3B, the combined thicknesses of the charge storage layer CTL and the tunnel insulating layer TIL may be less than half of the thickness of the insulating pattern 112. For example, the charge storage layer CTL and the tunnel insulating layer TIL may define an empty space in the enlarged region 117 between the gate patterns 160. And the empty space defined by the vertical insulator 121 may be filled with the channel structure 210.

Figure 3D:
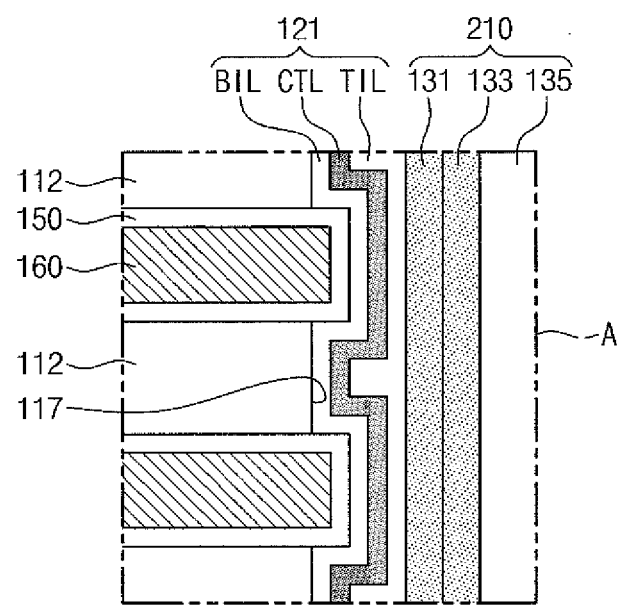

According to an exemplary embodiment illustrated in FIGS. 3A and 3D, the tunnel insulating layer TIL of the vertical insulator 121 may fill the empty space defined in the enlarged region 117 in which the charge storage layer CTL is formed. For example, the tunnel insulating layer TIL may have a protrusion disposed between the gate patterns 160 vertically adjacent to each other.

According to exemplary embodiments illustrated in FIGS. 3B, 3C, 3E, and 3F, the channel structure 210 may fill the empty space defined in the enlarged region 117 in which the charge storage layer CTL and the tunnel insulating layer TIL are formed. For example, the channel structure 210 may have a protrusion disposed between the gate patterns 160 vertically adjacent to each other. That is, a thickness of the channel structure 210 between the insulating pattern 112 and the filling insulating pattern 135 may be greater than that of the channel structure 210 between the filling insulating pattern 135 and the gate pattern 160.

Figure 3E:
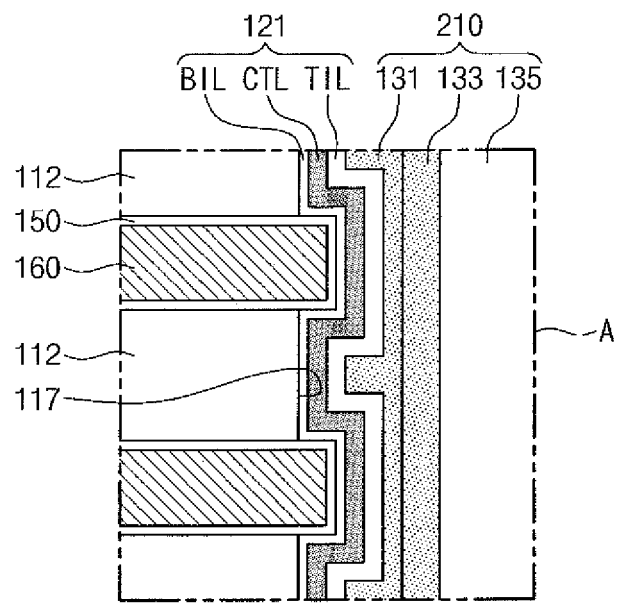
Figure 3F:
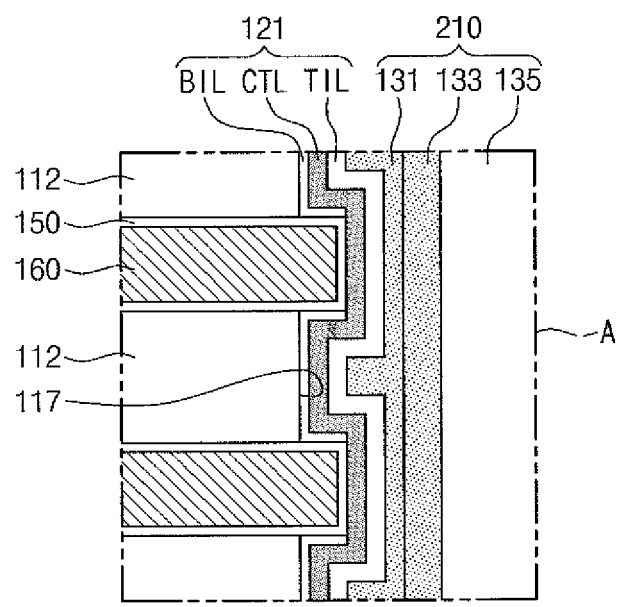

Meanwhile, according to embodiments illustrated in FIGS. 3D to 3F, the vertical insulator 121 may include a blocking insulating layer BIL, the charge storage layer CTL, and the tunnel insulating layer TIL. The blocking insulating layer BIL and the charge storage layer CTL may cover the inner surface of the enlarged region 117 and define an empty space in the enlarged region 117. According to an exemplary embodiment of the inventive concept illustrated in FIG. 3F, the vertical insulator 121 may include the blocking insulating layer BIL, the charge storage layer CTL, and the tunnel insulating layer TIL, and the blocking insulating layer BIL may be locally formed between the insulating pattern 112 and the charge storage layer CTL.

According to embodiments of the inventive concept, the horizontal insulator 150 may include a blocking insulating layer of a flash memory device. For example, as shown in FIG. 3C, the horizontal insulator 150 may include first and second blocking insulating layers BIL1 and BIL2.

According to embodiments of the inventive concept, the charge storage layer CTL may include a trap insulating layer, or an insulating layer including conductive nano dots. For example, the charge storage layer CTL may include a silicon nitride layer, a silicon oxynitride layer, a silicon-rich nitride layer, a nano-crystalline silicon layer, and/or a laminated trap layer.

According to embodiments of the inventive concept, the tunnel insulating layer TIL may include at least one of materials having an energy band gap greater than that of the charge storage layer CTL. For example, the tunnel insulating layer TIL may include a silicon oxide layer.

The blocking insulating layer BIL may include at least one of materials having an energy band gap smaller than that of the tunnel insulating layer TIL and greater than that of the charge storage layer CTL. For example, the blocking insulating layer BIL may include at least one high-k dielectric layer that includes an aluminum oxide layer and/or a hafnium oxide layer. In this aspect, a dielectric constant of the blocking insulating layer BIL may be substantially greater than that of the tunnel insulating layer TIL.

As shown in FIG. 3C, the blocking insulating layer BIL may include the first and second blocking insulating layers BIL1 and BIL2. The first and second blocking insulating layers BIL1 and BIL2 may be formed of materials different from each other. For example, one of the first and second blocking insulating layers BIL1 and BIL2 may be formed of at least one of materials having an energy band gap smaller than that of the tunnel insulating layer TIL and greater than that of the charge storage layer CTL, and the other of the first and second blocking insulating layers BIL1 and BIL2 may be formed of a material having an energy band gap greater than that of the one. For example, one of the first and second blocking insulating layers BIL1 and BIL2 may include at least one high-k dielectric layer such as an aluminum oxide layer and/or a hafnium oxide layer, and the other of the first and second blocking insulating layers BIL1 and BIL2 may include a silicon oxide layer. In this aspect, an effective dielectric constant of the combined first and second blocking insulating layers BIL1 and BIL2 may be greater than that of the tunnel insulating layer TIL.

Figure 4:
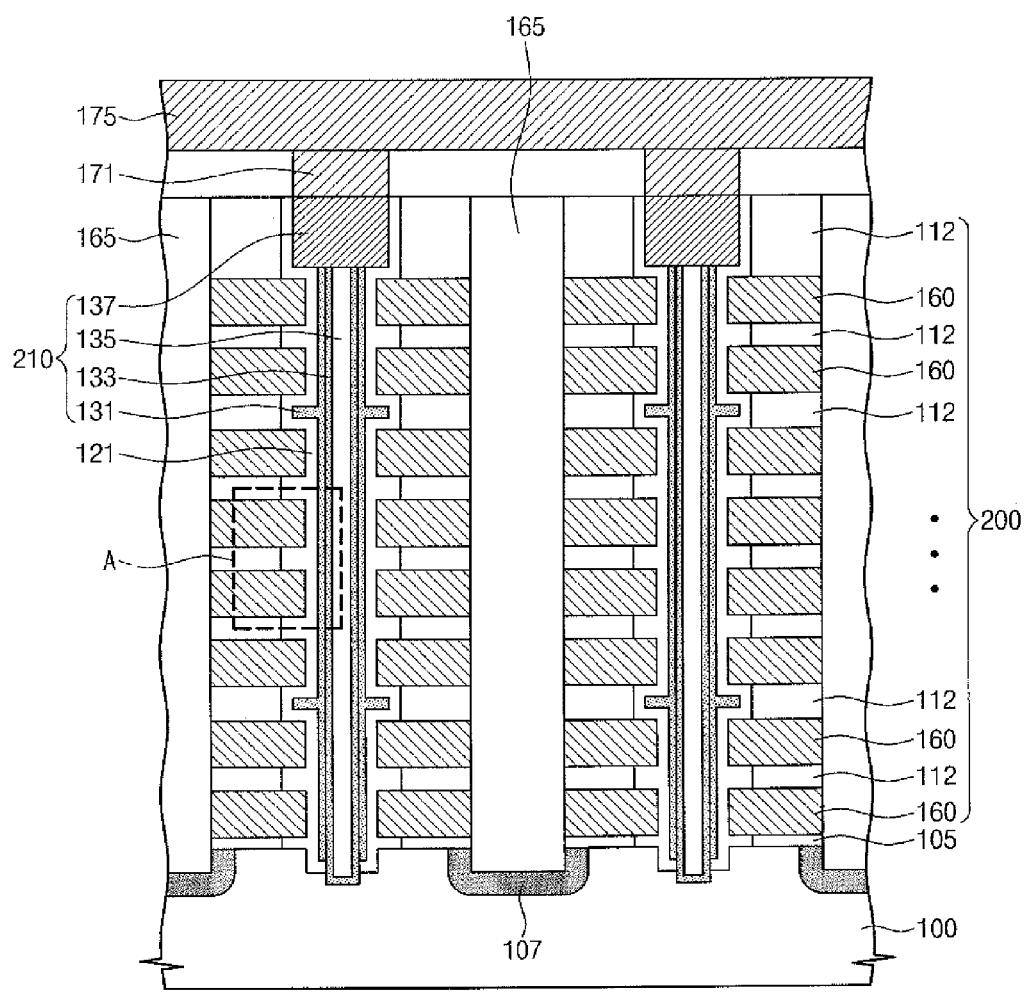
FIG. 4 is a cross-sectional view illustrating a 3D semiconductor memory device according to an exemplary embodiment of the inventive concept.
Figure 5A:
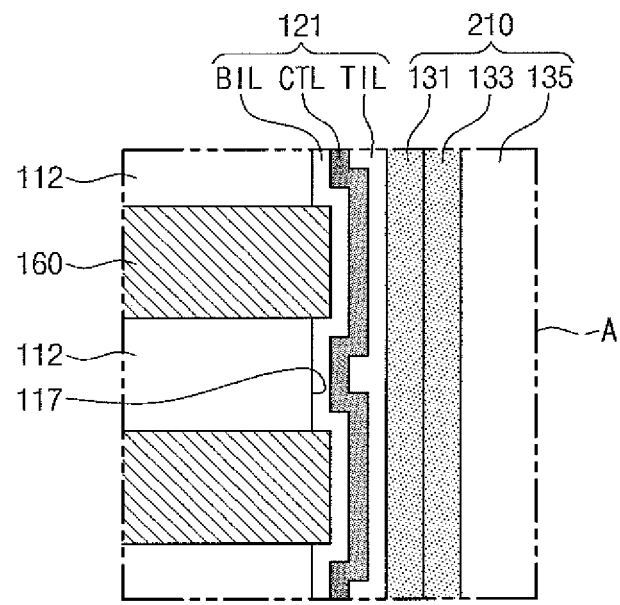
FIGS. 5A and 5B are enlarged views of a portion A of FIG. 4.
Figure 5B:
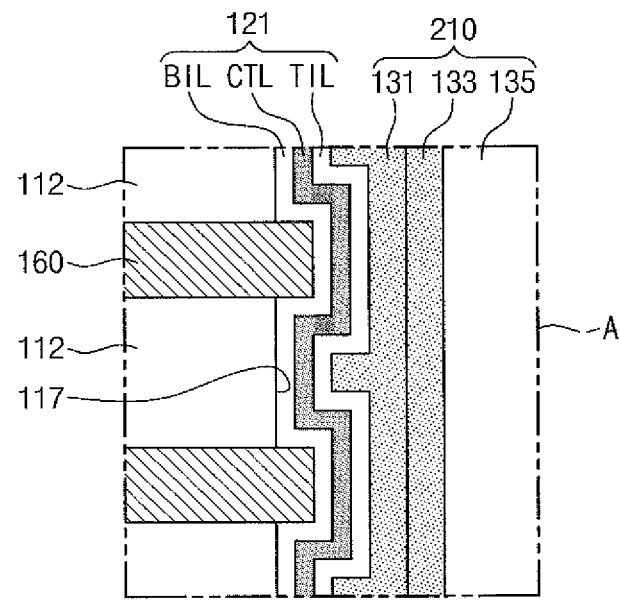

FIG. 4 is a cross-sectional view illustrating a three dimensional semiconductor memory device according to embodiments of the inventive concept. FIGS. 5A and 5B are enlarged views of portion A of FIG. 4. The descriptions of the same elements as provided above will be omitted or mentioned briefly for the purpose of ease and convenience in explanation.

Referring to FIG. 4, the three dimensional semiconductor memory device need not include the horizontal insulator 150 of FIG. 2 between the vertical insulator 121 and the gate patterns 160 unlike the arrangement illustrated in FIG. 2. For example, the gate patterns 160 may be directly in contact with the vertical insulator 121. Since the horizontal insulator 150 is omitted, it is possible to reduce a vertical height of the stack structure 200 including the insulating patterns 112 and the gate patterns 160.

Referring to FIGS. 5A and 5B, the vertical insulator 121 may include a blocking insulating layer BIL, a charge storage layer CTL, and a tunnel insulating layer TIL. The blocking insulating layer BIL may be directly in contact with the gate patterns 160. In an exemplary embodiment of the inventive concept, the blocking insulating layer BIL may consist of first and second blocking insulating layers formed of materials different from each other.

In an exemplary embodiment of the inventive concept, the blocking insulating layer BIL and the charge storage layer CTL may be conformally disposed on an inner sidewall of the stack structure 200. The combined thickness of the blocking insulating layer BIL and the charge storage layer CTL may be less than half of the thickness of the insulating pattern 112. Thus, the blocking insulating layer BIL and the charge storage layer CTL may have substantially uniform thicknesses on the inner sidewall of the stack structure 200 and may define empty spaces in the enlarged regions 117. Referring to FIG. 5A, the tunnel insulating layer TIL may fill the empty spaces defined by the charge storage layer CTL. For example, the tunnel insulating layer TIL may have protrusions formed in the empty spaces. As a result, a portion of the tunnel insulating layer TIL adjacent to the insulating pattern 112 may be thicker than a portion of the tunnel insulating layer TIL adjacent to the gate pattern 160. In an exemplary embodiment of the inventive concept of the inventive concept, as illustrated in FIG. 5B, the channel structure 210 may fill empty spaces defined by the vertical insulator 121, and the channel structure 210 may have protrusions formed in the empty spaces.

Figure 6:
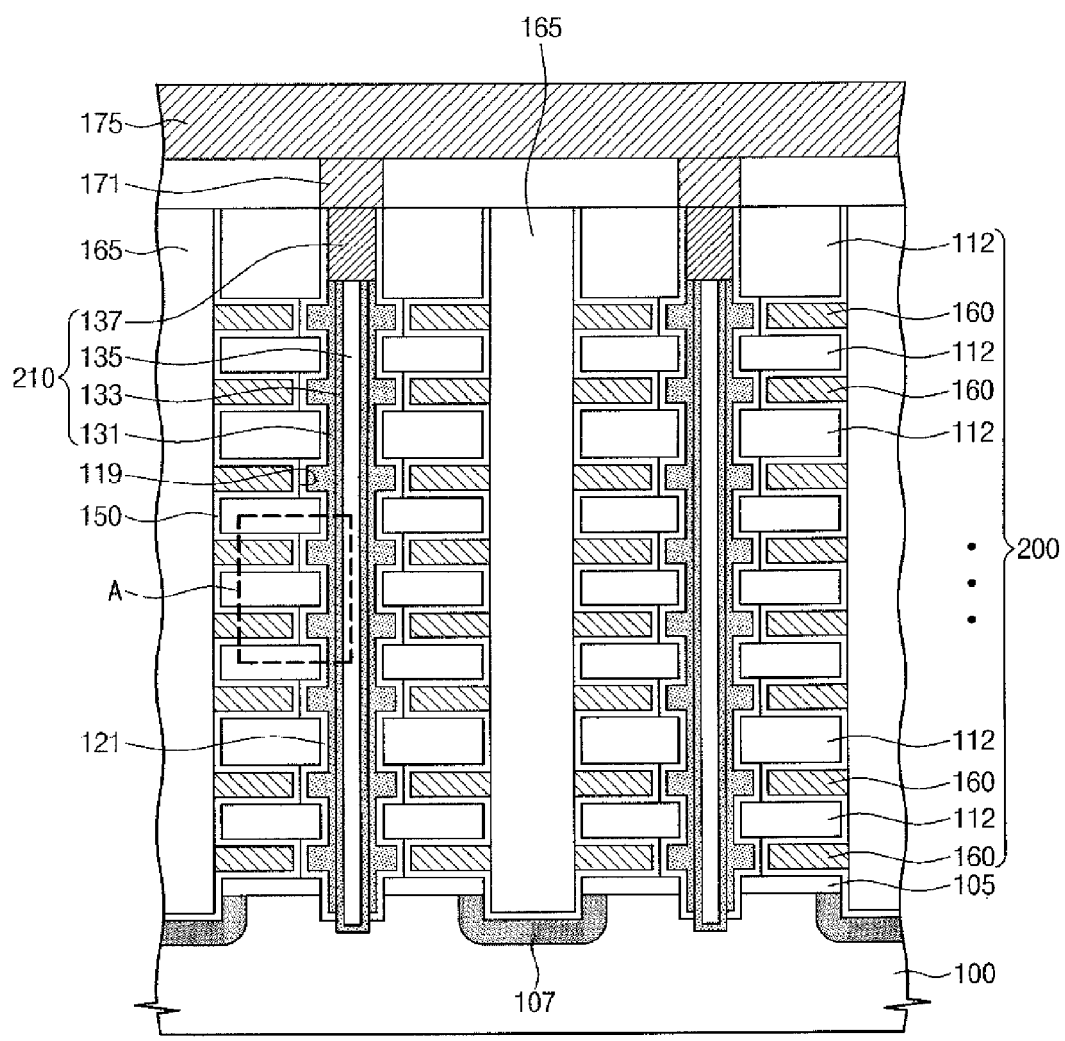
FIG. 6 is a cross-sectional view illustrating a 3D semiconductor memory device according to an exemplary embodiment of the inventive concept.

FIG. 6 is a cross-sectional view illustrating a three dimensional semiconductor memory device according to an exemplary embodiment of the inventive concept of the inventive concept. FIGS. 7A to 7D are enlarged views of portion A of FIG. 6. In the present embodiment, the descriptions of the same elements as in the above embodiments will be omitted or mentioned briefly for the purpose of ease and convenience in explanation.

Referring to FIG. 6, a stack structure 200 may be disposed on the substrate 100. The stack structure 200 may include insulating patterns 112 and gate patterns 160 which are alternately and repeatedly stacked. In the present embodiment, a width of each of the gate patterns 160 may be smaller than that of each of the insulating patterns 112. Thus, the stack structure 200 may include an inner sidewall having a plurality of enlarged regions 119 vertically spaced apart from each other. In the present embodiment, each of the enlarged regions 119 may be defined between the insulating patterns 112 vertically adjacent to each other as illustrated in FIGS. 7A to 7D.

The channel structure 210 may penetrate the stack structure 200 and may be connected to the substrate 100. The channel structure 210 may include the first and second semiconductor patterns 131 and 133 and the filling insulating pattern 135 as described in the above embodiment of FIG. 2.

A vertical insulator 121 may conformally cover the inner sidewall of the stack structure 200 which has the enlarged regions 119. For example, the vertical insulator 121 may be unevenly formed between the stack structure 200 and the channel structure 210. The vertical insulator 121 may conformally cover inner surfaces of the enlarged regions 119 and may extend between the channel structure 210 and the insulating patterns 112. The vertical insulator 121 may be formed to have a substantially uniform thickness.

A horizontal insulator 150 may be disposed between the stack structure 200 and the vertical insulator 121. The horizontal insulator 150 may substantially horizontally extend to cover bottom and top surfaces of the gate pattern 160. The horizontal insulator 150 may include a single thin layer or a plurality of thin layers as described above.

Figure 7A:
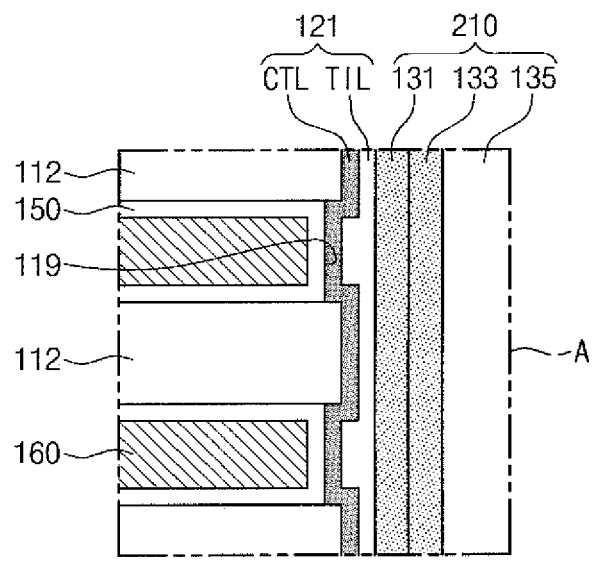
FIGS. 7A to 7D are enlarged views of a portion A of FIG. 6.
Figure 7B:
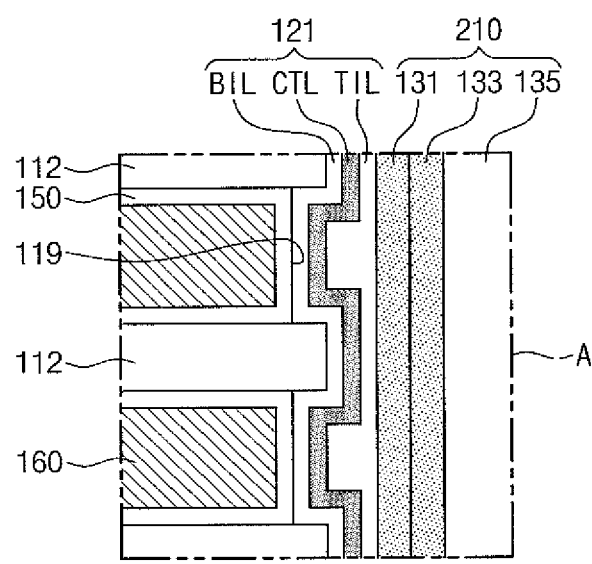
Figure 7C:
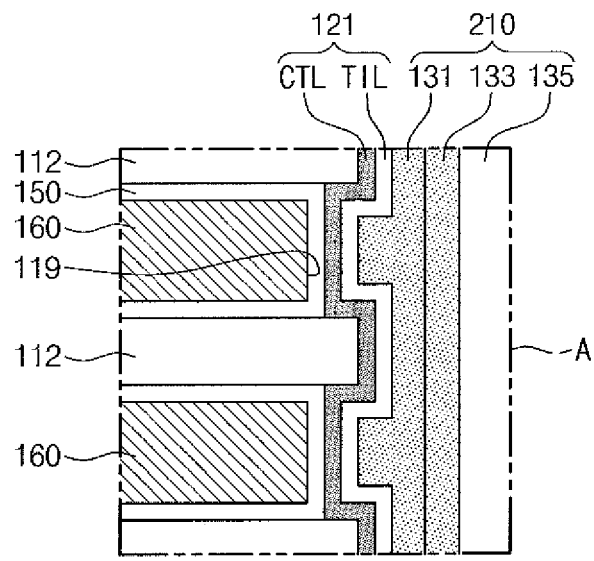

Referring to FIGS. 7A and 7B, the vertical insulator 121 may include the charge storage layer CTL and the tunnel insulating layer TIL. The charge storage layer CTL may conformally cover the inner sidewall of the stack structure 200. In the present embodiment, the charge storage layer CTL may conformally cover the inner surface of the enlarged region 119 defined between the insulating patterns 112 vertically adjacent to each other. The charge storage layer CTL may have a thickness less than half of the thickness (e.g., a vertical distance between the insulating patterns 112) of the gate pattern 160. Thus, the charge storage layer CTL may conformally cover the inner surface of the enlarged region 119 and define an empty space in the enlarged region 119. The charge storage layer CTL may have a substantially uniform thickness on the inner sidewall of the stack structure 200. For example, the charge storage layer CTL may be adjacent to one sidewall of the gate pattern 160 between the insulating patterns 112 and may extend onto top and bottom surfaces of the insulating patterns 112. The charge storage layer CTL may also extend between the channel structure 200 and the insulating patterns 112.

As shown in FIG. 7A, the tunnel insulating layer TIL may fill the empty spaces defined by the charge storage layer CTL. For example, a portion of the tunnel insulating layer TIL between the gate pattern 160 and the channel structure 210 may be thicker than a portion of the tunnel insulating layer TIL between the insulating pattern 112 and the channel structure 210. The tunnel insulating layer TIL may have protrusions between the channel structure 210 and the gate patterns 160.

As shown in FIG. 7B, the tunnel insulating layer TIL may be formed on the charge storage layer CTL with a uniform thickness, and the channel structure 210 may fill the parts of the enlarged regions 119 on which the charge storage layer CTL and the tunnel insulating layer TIL are formed. For example, the channel structure 210 may have protrusions between the channel structure 210 and the gate patterns 160. A portion of the channel structure 210 adjacent to the gate pattern 160 may be thicker than a portion of the channel structure 210 adjacent to the insulating pattern 112.

Figure 7D:
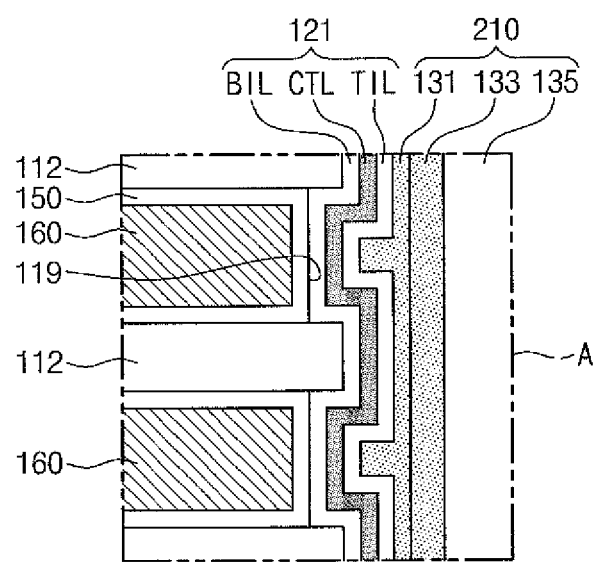

Referring to FIGS. 7B and 7D, the vertical insulator 121 may include a blocking insulating layer BIL, the charge storage layer CTL, and the tunnel insulating layer TIL. The blocking insulating layer BIL and the charge storage layer CTL may conformally cover the inner sidewall of the stack structure 200. The combined thickness of the blocking insulating layer BIL and the charge storage layer CTL may be less than half of the thickness (e.g., a vertical distance between the insulating patterns 112) of the gate pattern 160. For example, the blocking insulating layer BIL and the charge storage layer CTL may have substantially uniform thicknesses, and empty spaces may be defined in the enlarged regions 119.

Referring to FIG. 7A, the tunnel insulating layer TIL may fill the empty spaces defined by the charge storage layer CTL. A portion of the tunnel insulating layer TIL adjacent to the gate pattern 160 may be thicker than a portion of the tunnel insulating layer TIL adjacent to the insulating pattern 112. In an exemplary embodiment of the inventive concept, the tunnel insulating layer TIL may be uniformly formed on the charge storage layer CTL as shown in FIG. 7D. Referring to FIG. 7D, a portion of the channel structure 210 adjacent to the gate pattern 160 may be thicker than a portion of the channel structure 211 adjacent to the insulating pattern 112.

Figure 8:
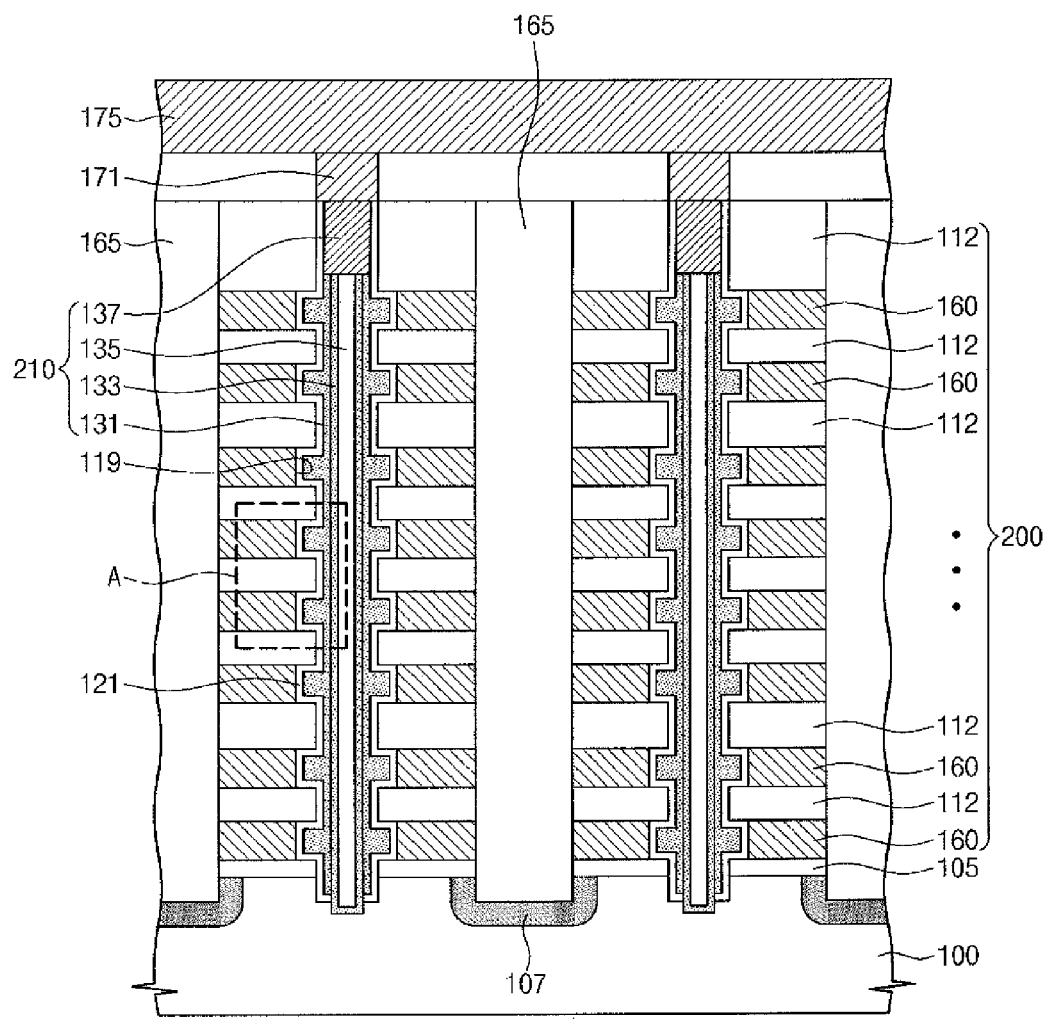
FIG. 8 is a cross-sectional view illustrating a 3D semiconductor memory device according to an exemplary embodiment of the inventive concept.
Figure 9A:
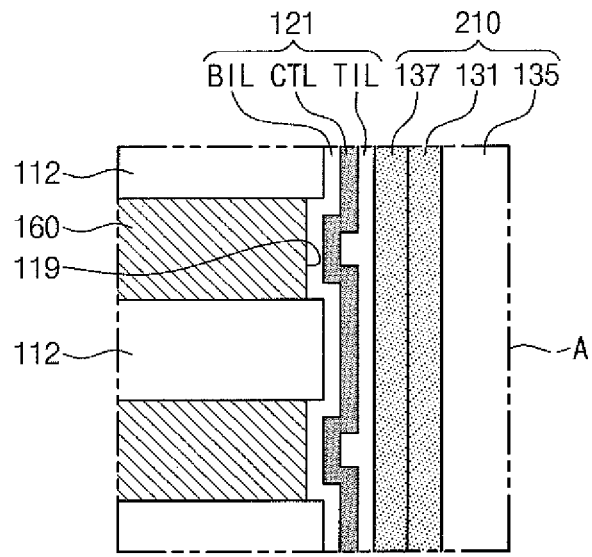
FIGS. 9A and 9B are enlarged views of a portion A of FIG. 8.
Figure 9B:
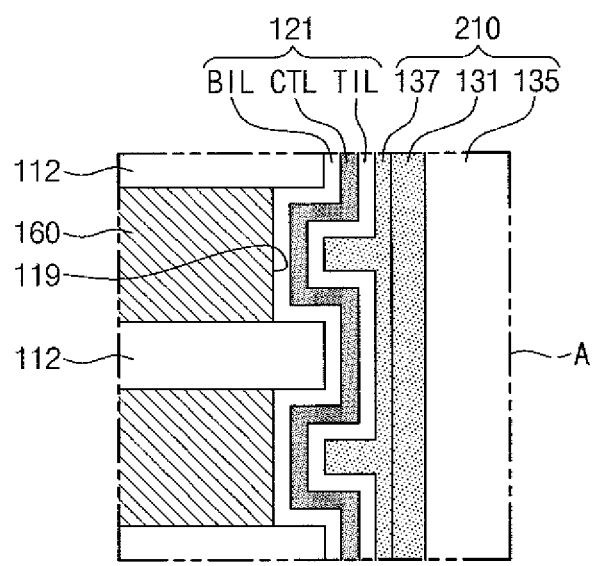

FIG. 8 is a cross-sectional view illustrating a three dimensional semiconductor memory device according to an exemplary embodiment of the inventive concept. FIGS. 9A and 9B are enlarged views of portion A of FIG. 8. In the present embodiment, the descriptions of the same elements as in the above embodiments will be omitted or mentioned briefly for the purpose of ease and convenience in explanation.

Referring to FIG. 8, the horizontal insulator 150 between the vertical insulator 121 and the gate patterns 160 may be omitted unlike the embodiment illustrated in FIG. 6. For example, the gate patterns 160 may be directly in contact with the vertical insulator 121.

Referring to FIGS. 9A and 9B, the vertical insulator 121 may include the blocking insulating layer BIL, the charge storage layer CTL, and the tunnel insulating layer TIL. The blocking insulating layer BIL may be directly in contact with the gate patterns 160. The blocking insulating layer BIL may include first and second blocking insulating layers.

In the present embodiment, the blocking insulating layer BIL and the charge storage layer CTL may conformally cover the inner surface of the enlarged region 119 defined between the insulating patterns 112 adjacent to each other. The combined thickness of the blocking insulating layer BIL and the charge storage layer CTL may be less than half of the thickness of the gate pattern 160. Thus, the blocking insulating layer BIL and the charge storage layer CTL may have substantially uniform thicknesses on the stack structure 200 and define empty spaces in the enlarged regions 119.

Referring to FIG. 9A, the tunnel insulating layer TIL may fill the empty spaces defined by the charge storage layer CTL. For example, the tunnel insulating layer TIL may have protrusions formed in the empty spaces. According to an exemplary embodiment of the inventive concept, as shown in FIG. 9B, the channel structure 210 may fill empty spaces defined by the vertical insulator 121. Thus, the channel structure 210 may have a plurality of protrusions formed in the empty spaces.

Figure 10:
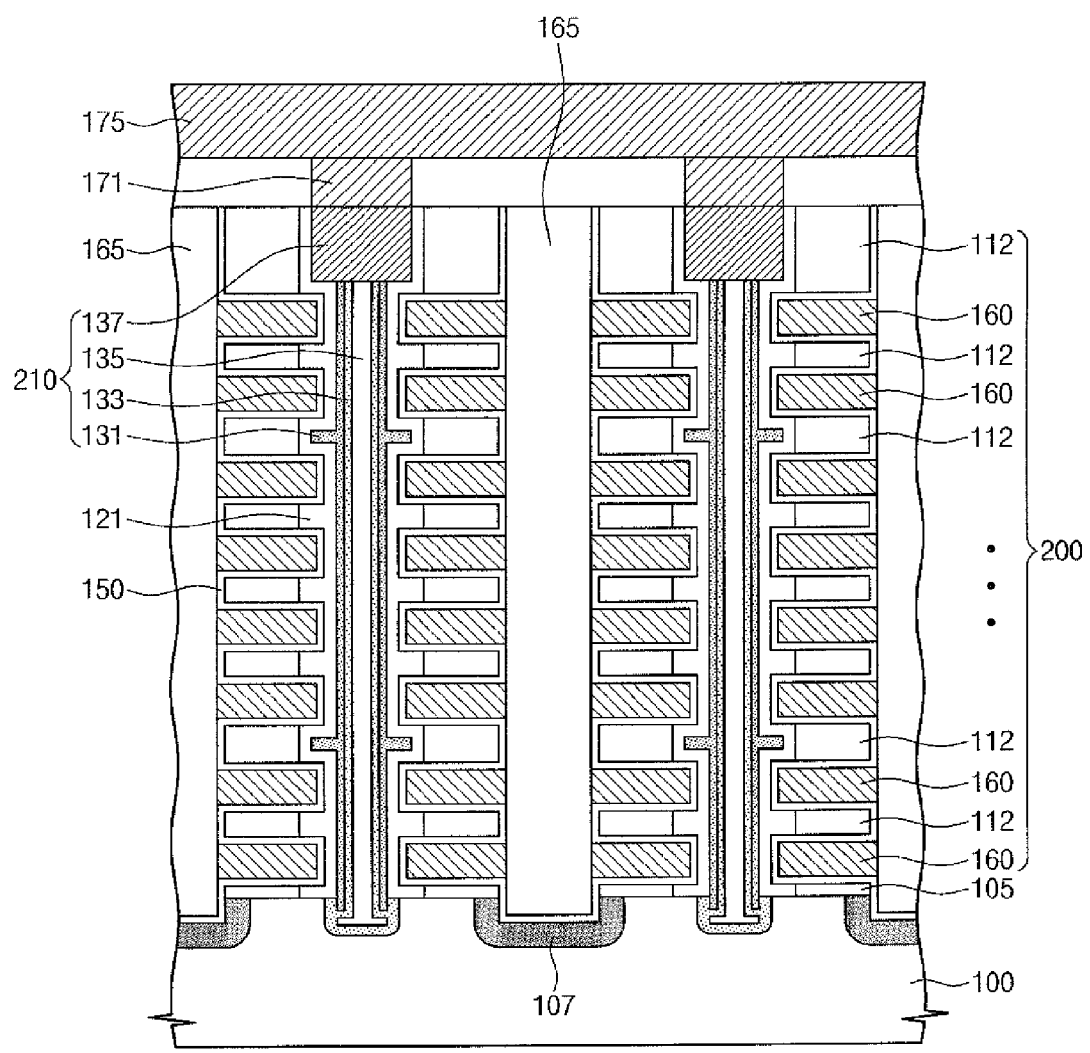
FIGS. 10 and 11 are cross-sectional views illustrating 3D semiconductor memory devices according to an exemplary embodiment of the inventive concept.
Figure 11:
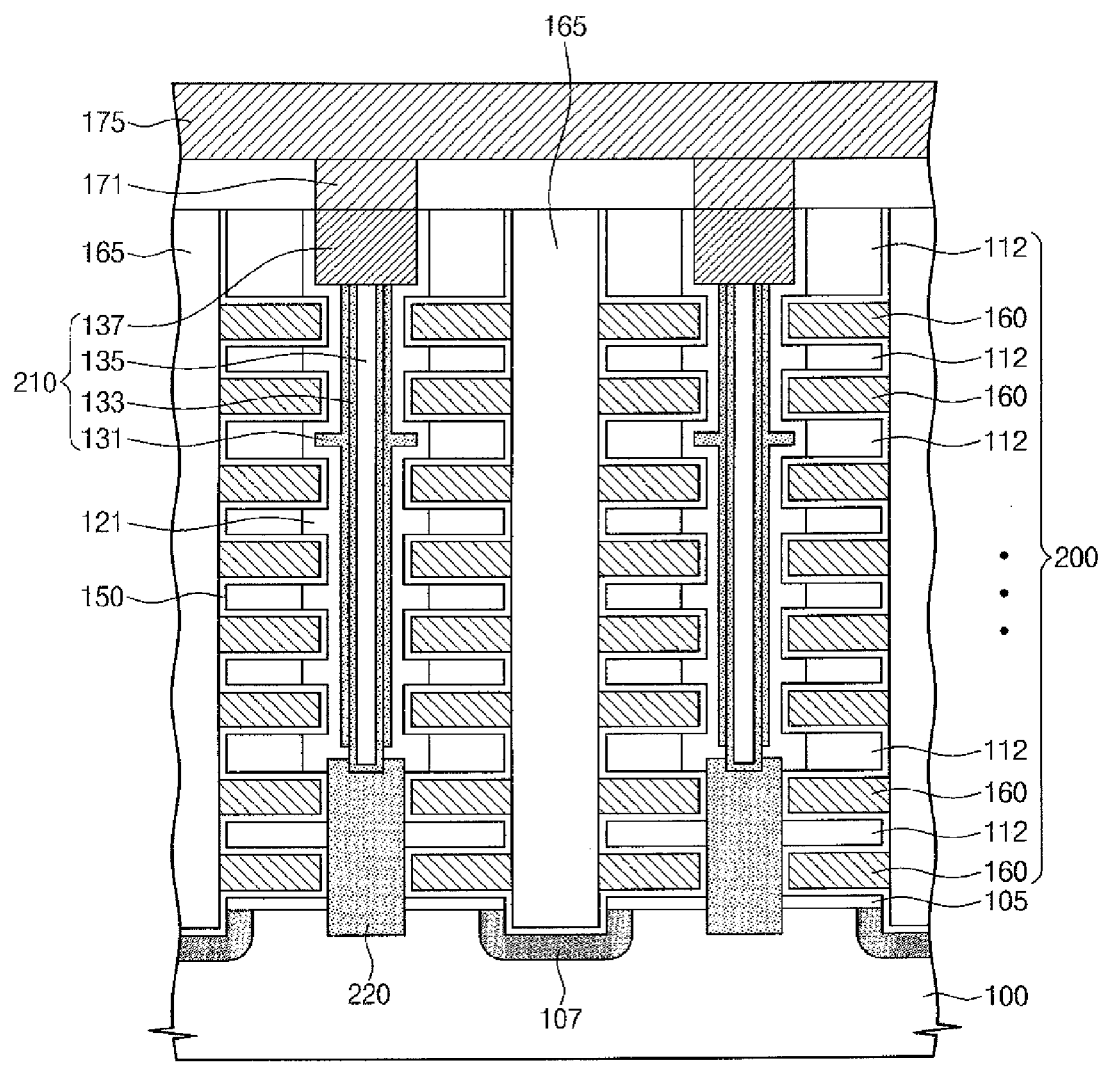

FIGS. 10 and 11 are cross-sectional views illustrating three dimensional semiconductor memory devices according to embodiments of the inventive concept. In the present embodiments, the descriptions of the same components as in the above elements will be omitted or mentioned briefly for the purpose of ease and convenience in explanation.

As shown in FIG. 10, a vertical length of the vertical insulator 121 may be less than that of the channel structure 210. For example, a bottom surface of the vertical insulator 121 may be disposed on the top surface of the substrate 100, and the channel structure 210 may be disposed on a recessed surface 109 of the substrate 100. The second semiconductor pattern 133 may be disposed on the recessed surface 109, covering bottom ends of the first semiconductor pattern 131 and the vertical insulator 121.

As shown in FIG. 11, a three dimensional semiconductor memory device may include a semiconductor pillar 220 which penetrates a lower portion of the stack structure 200. The semiconductor pillar 220 may be disposed between the channel structure 210 and the substrate 100. The semiconductor pillar 220 may be inserted partially in the substrate and may have a bottom surface disposed at a level lower than the top surface of the substrate 100.

The insulating pattern 112 adjacent to the semiconductor pillar 220 may be in contact with a sidewall of the semiconductor pillar 220. And the horizontal insulator 150 may be disposed between the semiconductor pillar 220 and the gate pattern 160 adjacent to the semiconductor pillar 220.

The insulating patterns 112 may have different widths according to their positions in the stack structure 200. The insulating patterns 112 positioned lower than the upper surface of semiconductor pillar 220 may have a width different from that of the gate patterns 160 positioned higher than the upper surface of the semiconductor pillar 220. The enlarged regions 117 may be defined by the insulating patterns 112 positioned higher than the upper surface of the semiconductor pillar 200.

The vertical insulator 121 and the channel structure 210 may be disposed on the semiconductor pillar 220. The channel structure 210 may penetrate an upper portion of the stack structure 200 partially and may be in contact with the semiconductor pillar 220. The channel structure 210 may include first and second semiconductor patterns 131 and 133 and a filling insulating pattern 135 as described above.

The vertical insulator 121 may be substantially vertical to the substrate 100 and have an uneven structure. The vertical insulator 121 may conformally cover a sidewall of the stack structure 200 which has the enlarged regions 117.

Hereinafter, a method of fabricating a three dimensional semiconductor memory device according to an exemplary embodiment of the inventive concept will be described with reference to FIGS. 12 to 20. FIGS. 12 to 20 are cross-sectional views of a three dimensional semiconductor memory device fabricated using a method according to an exemplary embodiment of the inventive concept.

Figure 12:
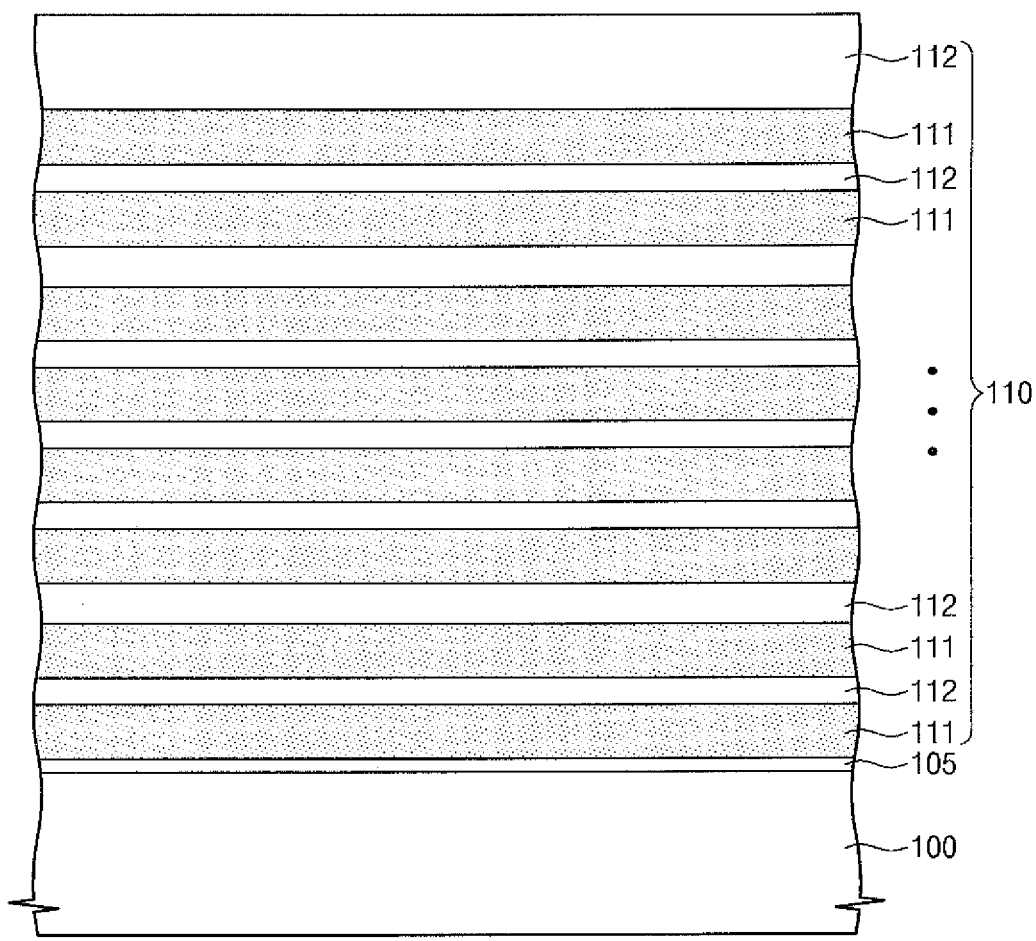
FIGS. 12 to 20 are cross-sectional views a method of fabricating a 3D semiconductor memory device according to an exemplary embodiment of the inventive concept.

Referring to FIG. 12, first material layers 111 and second material layers 112 may be alternately and repeatedly stacked on a substrate 100 to form a thin layered-structure 110.

The substrate 100 may include a semiconductor material having semiconductor properties, an insulating material, a semiconductor material covered with an insulating material, or a conductive material covered with an insulating material. For example, the substrate 100 may be a silicon wafer.

The first material layers 111 may include a material having etch selectivity with respect to the second material layers 112. In an exemplary embodiment of the inventive concept, an etch selectivity ratio of the first material layers 111 and the second material layers 112 may be high in a wet etching process using a chemical solution. In an exemplary embodiment of the inventive concept, the etch selectivity ratio of the first material layers 111 and the second material layers 112 may be low in a dry etching process using an etch gas. The first material layers 111 and the second materials layers 112 may have substantially the same thickness or may have different thicknesses.

The first and second material layers 111 and 112 may be deposited using a thermal chemical vapor deposition (CVD) technique, a plasma enhanced CVD technique, a physical CVD, and/or an atomic layer deposition (ALD) technique.

In an exemplary embodiment of the inventive concept, the first and second material layers 111 and 112 may be formed of insulating materials. The second material layers 112 may have etch selectivity with respect to the first material layers 111. For example, the first material layers 111 may include a silicon layer, a silicon oxide layer, a silicon carbide layer, a silicon oxynitride layer, and/or a silicon nitride layer. The second material layers 112 may include a silicon layer, a silicon oxide layer, a silicon carbide layer, a silicon oxynitride layer, and/or a silicon nitride layer. The second material layer 112 may be formed of a material different from that of the first material layer 111. For example, the first material layers 111 may include silicon nitride layers, and the second material layers 112 may include silicon oxide layers. In an exemplary embodiment of the inventive concept, the first material layers 111 may be formed of a conductive material and the second material layer 112 may be formed of an insulating material.

Figure 13:
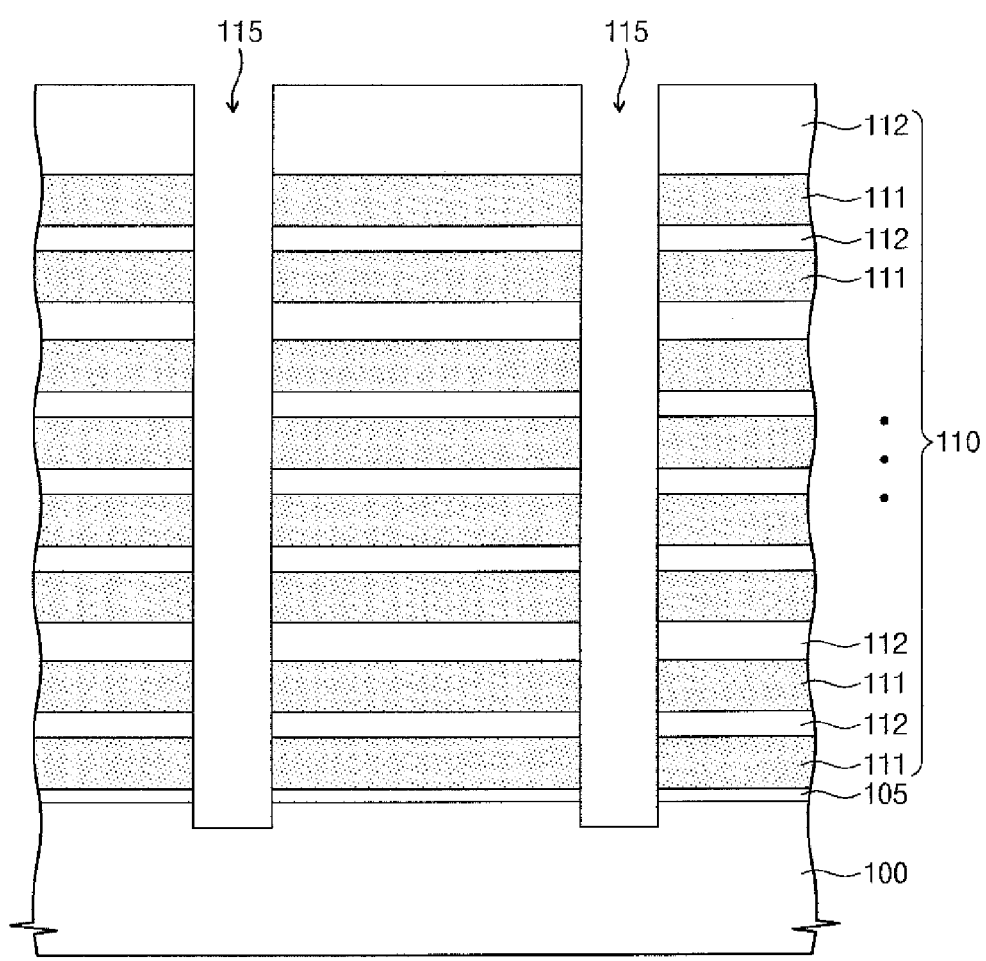

Referring to FIG. 13, the thin-layered structure 110 may be patterned to form openings 115 penetrating the thin-layered structure 110. The openings 115 may expose the substrate 100 and layers 111 and 112 of the thin-layered structure 110.

The openings 115 may have hole-shapes. In the openings 115, layers 112 and 112 may have sides aligned in a cross-sectional view. The opening 115 may have a depth at least five times greater than a width of the opening 115. The openings 115 may be two-dimensionally arranged in a top surface of the substrate (e.g., an xy plane). For example, each of the openings 115 may be an isolated region which is spaced apart from other openings 115 along an x-axis direction and a y-axis direction. In an exemplary embodiment of the inventive concept, the openings 115 may be arranged in zigzag pattern in the y-axis direction. The openings 115 may be space apart in one direction at a distance equal to or smaller than the width of the opening 115.

A mask pattern (not shown) may be formed on the thin layer-structure 110 and then the thin layer-structure 110 may be anisotropically etched using the mask pattern (not shown) as an etch mask to form the openings 115. The top surface of the substrate 100 may be over-etched in the anisotropic etching process. Thus, the substrate 100 under the opening 115 may be recessed by a predetermined depth.

Figure 14:
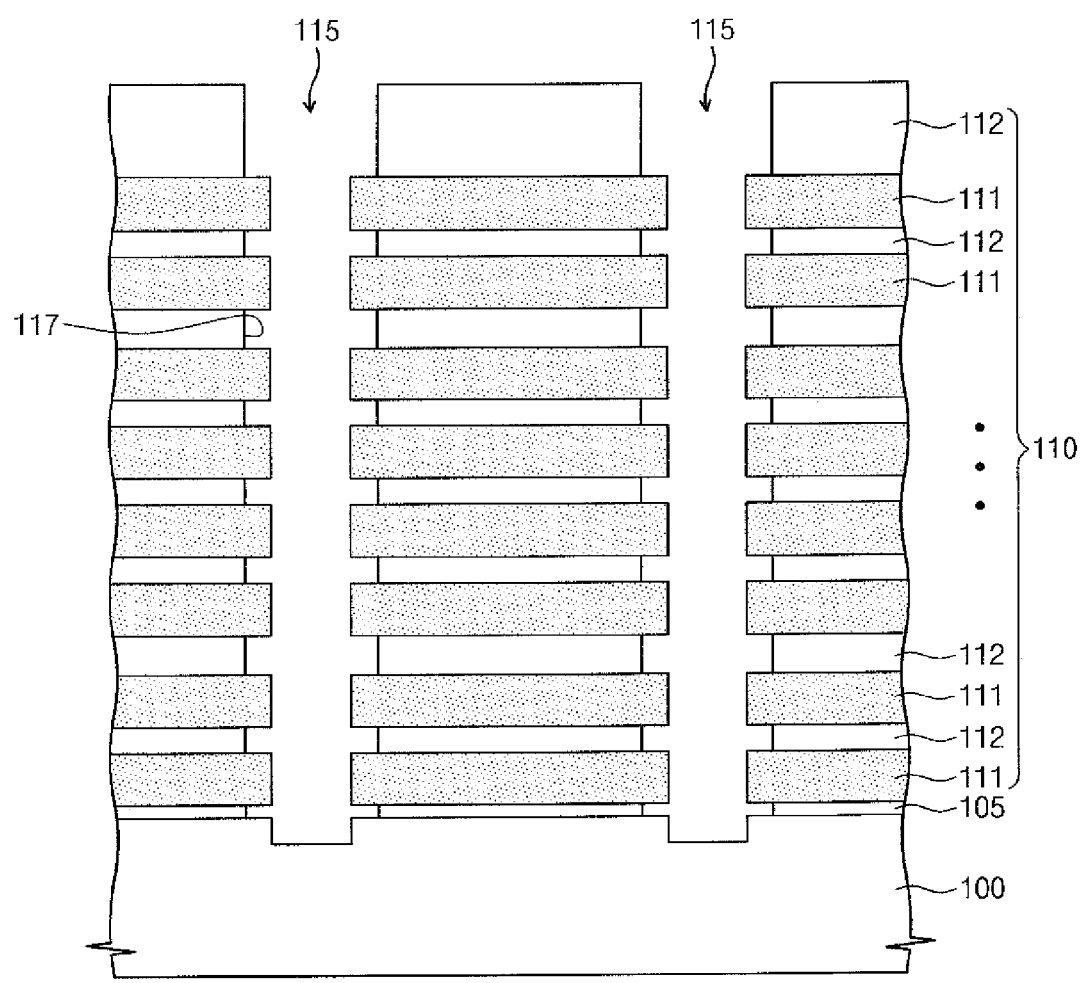

Referring to FIG. 14, the second material layers 112 exposed by the opening 115 may be partially removed to form enlarged regions 117.

The second material layers 112 may be isotropically etched partially using an etchant having etch selectivity with respect to the first material layers 111 and the substrate 100 to form the enlarged regions 117. As a result, the thin layer-structure 110 may have an uneven inner sidewall including the enlarged regions 117 vertically spaced apart from each other. In more detail, sidewalls of the second material layers 112 exposed by the opening 115 may be etched to form the enlarged regions 117. The enlarged regions 117 may horizontally extend between the first material layers 111 from the opening 115. The enlarged regions 117 may expose portions of top and bottom surfaces of the first material layers 111. For example, the enlarged region 117 may be defined by one sidewall of the recessed second material layer 112 and the top surface and bottom surface of the first material layers 111 under and on the recessed second material layer 112.

Figure 15:
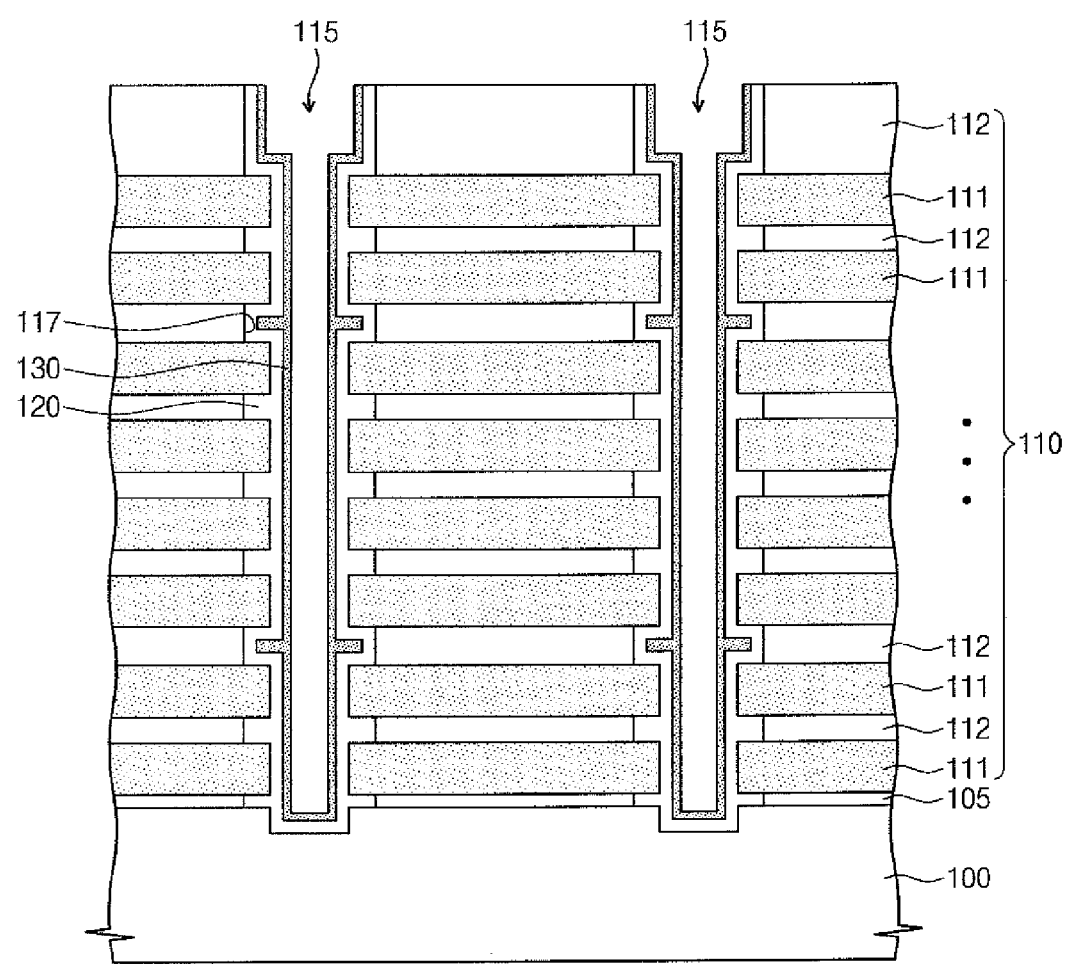

Referring to FIG. 15, a vertical insulating layer 120 and a first semiconductor layer 130 may be sequentially formed to cover the inner sidewall of opening 115 at which the enlarged regions 117 are formed.

The combined thicknesses of the vertical insulating layer 120 and the first semiconductor layer 130 may be smaller than half of the width of the opening 115. For example, the opening 115 may be partially filled with the vertical insulating layer 120 and the first semiconductor layer 130. The vertical insulating layer 120 may cover the top surface of the substrate exposed by the opening 115.

The vertical insulating layer 120 may be deposited conformally to cover the inner sidewall of the thin layer-structure 110 at which the enlarged regions 117 are formed. For example, the vertical insulating layer 120 may be deposited by a plasma enhanced CVD technique, a physical CVD technique, and/or a ALD technique.

The vertical insulating layer 120 may be formed of a plurality of thin layers. In an exemplary embodiment of the inventive concept, the vertical insulating layer 120 may include a charge storage layer CTL and a tunnel insulating layer TIL. The charge storage layer CTL may be used as a memory element of a charge trap type flash memory device. In an exemplary embodiment of the inventive concept, the vertical insulating layer 120 may include a blocking insulating layer BIL, the charge storage layer CTL, and the tunnel insulating layer TIL. The vertical insulating layer 120 may be formed to have one of various shapes as described with reference to FIGS. 2 and 3A to 3F. Here, the charge storage layer CTL may be deposited with a substantially uniform thickness as shown in FIGS. 3A to 3F and may define the empty spaces in the enlarged regions 117. The vertical insulating layer 120 including a plurality of thin layers may completely fill the enlarged regions 117 or may define the empty spaces in the enlarged regions 117.

The first semiconductor layer 130 may be conformally formed on the vertical insulating layer 120. In an exemplary embodiment of the inventive concept, the first semiconductor layer 130 may be formed of a semiconductor material (e.g., a polycrystalline silicon layer, a single-crystalline silicon layer, or an amorphous silicon layer) which is formed by an ALD technique or a CVD technique. In an exemplary embodiment of the inventive concept, the first semiconductor layer 130 may be formed of an organic semiconductor layer and/or a carbon nano structure. In an exemplary embodiment of the inventive concept, if the vertical insulating layer 120 partially fills the enlarged regions 117, the first semiconductor layer 130 may fill remaining spaces of the enlarged regions 117.

Figure 16:
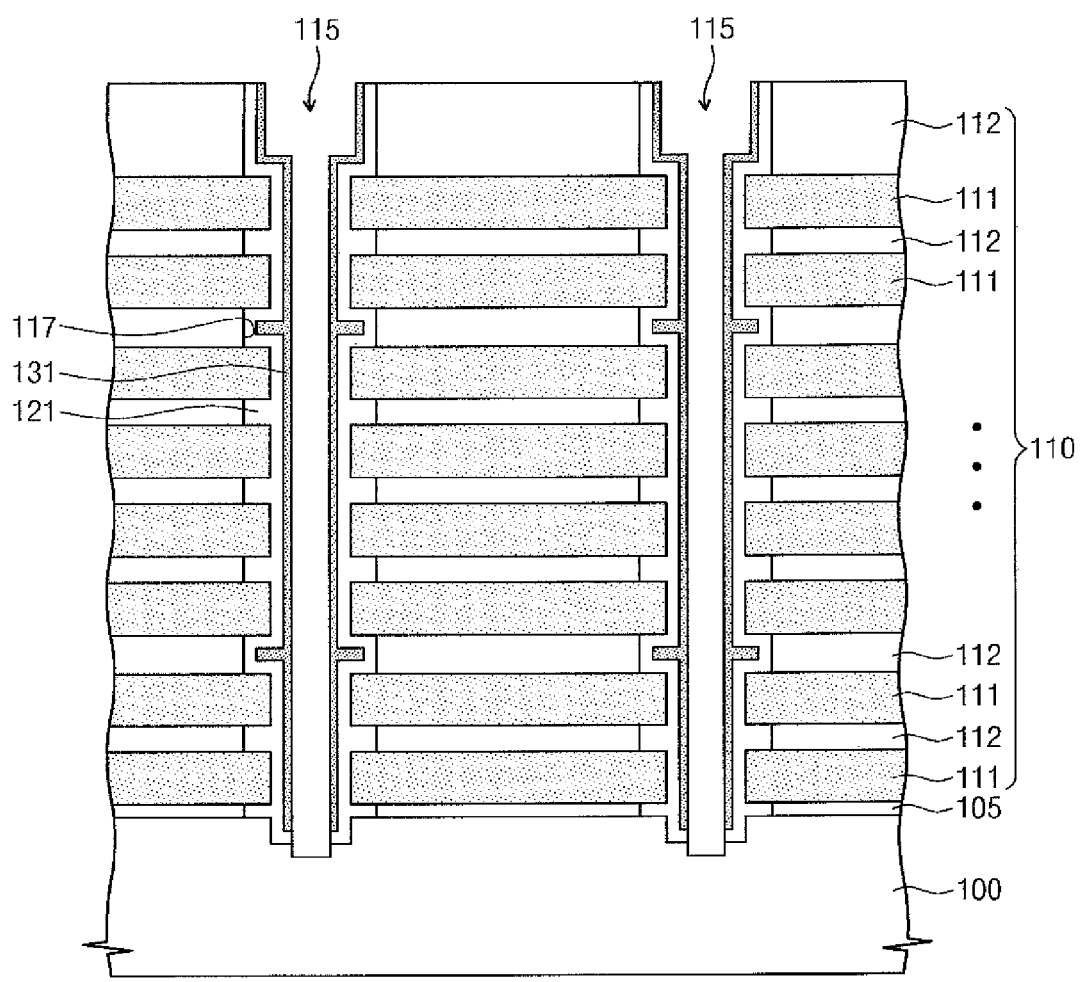

Referring to FIG. 16, the bottom surfaces of the openings 115 may be etched to expose the substrate 100 by etching the first semiconductor layer 130 and the vertical insulating layer 120 partially. Thus, a first semiconductor pattern 131 and a vertical insulator 121 may be formed on the inner sidewall of the opening 115. For example, the vertical insulator 121 and the first semiconductor pattern 131 may be formed to have a pipe shape of which both ends are open. While the first semiconductor layer 130 and the vertical insulating layer 120 are anisotropically etched, a top surface of the substrate exposed by the first semiconductor pattern 131 may be recessed by an over-etch process.

In an exemplary embodiment of the inventive concept, while the first semiconductor layer 130 and the vertical insulating layer 120 are anisotropically etched, a portion of the vertical insulating layer 120 under the first semiconductor pattern 131 may be etch-resistant. In this case, the vertical insulator 121 may have a bottom portion disposed between the first semiconductor pattern 131 and the substrate 100.

Additionally, the top surface of the thin-layered structure 110 may be exposed after the first semiconductor layer 130 and the vertical insulating layer 120 are anisotropically etched. Thus, the combined layers of the vertical insulators 121 and the first semiconductor patterns 131 may be locally disposed in each of the openings 115. The vertical insulators 121 and the first semiconductor patterns 131 may be two-dimensionally arranged in a plan view.

Figure 17:
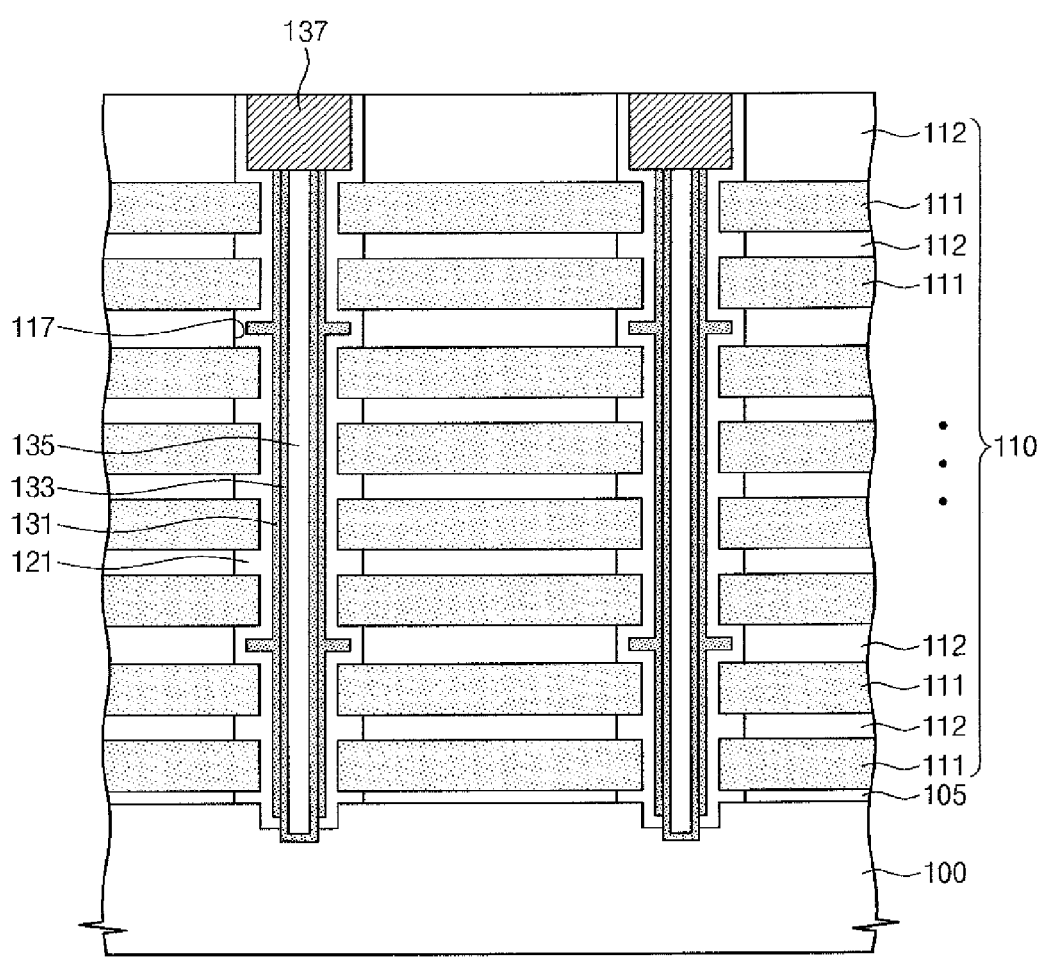

Referring to FIG. 17, a second semiconductor pattern 133 and a filling insulating pattern 135 may be sequentially formed on the structure of FIG. 16.

A second semiconductor layer (not shown) and a filling insulating layer (not shown) may be sequentially formed in the opening 115 in which the vertical insulator 121 and the first semiconductor pattern 131 are formed. The second semiconductor layer and the filling insulating layer may be planarized until the top surface of the thin layer-structure 110 is exposed. Thus, the second semiconductor pattern 133 and the filling insulating pattern 135 may be formed.

The second semiconductor layer may be formed of a semiconductor material (e.g., poly-crystalline silicon, single-crystalline silicon, or amorphous silicon) which is formed using an ALD technique and/or a CVD technique. In an exemplary embodiment of the inventive concept, the second semiconductor layer may be conformally formed in the opening 115. The second semiconductor layer may have a thickness not completely filling the opening 115. For example, the second semiconductor pattern 133 may be formed to have a pipe-shape, a hollow cylindrical shape, or a cup-shape in the opening 115. In an exemplary embodiment of the inventive concept, the second semiconductor pattern 133 may fill the opening 115.

The filling insulating pattern 135 may fill the opening 115 in which the second semiconductor pattern 133 is formed. The filling insulating pattern 135 may include insulating materials or a silicon oxide layer which are formed using a spin-on-glass (SOG) technique.

After the second semiconductor pattern 133 and the filling insulating pattern 135 are formed, the upper portions of the first and second semiconductor patterns 131 and 133 and the filling insulating pattern 135 are recessed. The recessed region may be filled with a conductive material (not shown) to form the conductive pad 137. The conductive pad 137 may be doped with dopants of a conductivity type different from those of the first and second semiconductor patterns 131 and 133 under the conductive pad 137.

In an exemplary embodiment of the inventive concept, before the second semiconductor pattern 133 is formed, a portion of the vertical insulator 121 between the bottom surface of the first semiconductor pattern 131 and the substrate 100 may be removed. The process removing the portion of the vertical insulator 121 may use an etching gas or an etching solution having etch selectivity with respect to the first semiconductor pattern 131. Thus, the second semiconductor pattern 133 may be formed to be directly in contact with the bottom surface of the first semiconductor pattern 131 as illustrated in FIG. 10. And the vertical insulator 121 may be spaced apart from the substrate 100.

Figure 18:
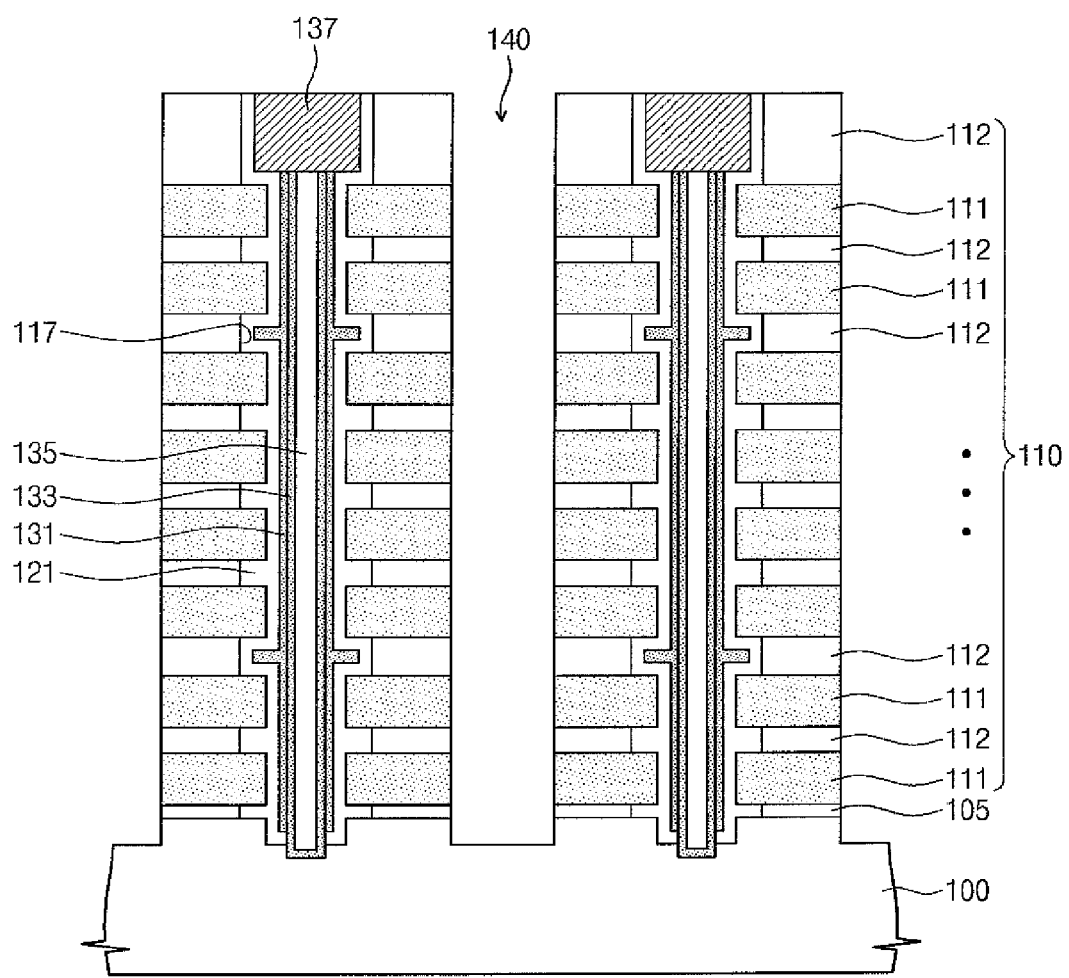

Referring to FIG. 18, the thin-layered structure may be patterned to form trenches 140 exposing the substrate 100 between adjacent openings 115.

For example, forming the trenches 140 may include forming a mask pattern (not shown) defining planar positions of the trenches 140 on the thin-layered structure 110; and anisotropically etching the thin-layered structure 110 using the mask pattern as an etch mask.

The trenches 140 may be spaced apart from the first and second semiconductor patterns 131 and 133 and may expose sidewalls of the first and second material layers 111 and 112. Each of the trenches 140 may be formed to have a line-shape or a rectangular shape in a plan view. The trenches 140 may be formed to expose the top surface of the substrate 100 in a vertical view. When the trenches 140 are formed, the substrate 100 may be used as an etch stop layer, and the top surface of the substrate 100 exposed by the trenches 140 may be recessed by a predetermined depth due to an over-etch process. A width of the trench 140 may be varied according to a height form the substrate 100 due to the anisotropic etching process.

Since the trenches 140 are formed, the thin-layered structure 110 may have a line-shape extending in one direction. A plurality of the first and second semiconductor patterns 131 and 133 may penetrate one thin layer-structure 110 of the line-shape.

Figure 19:
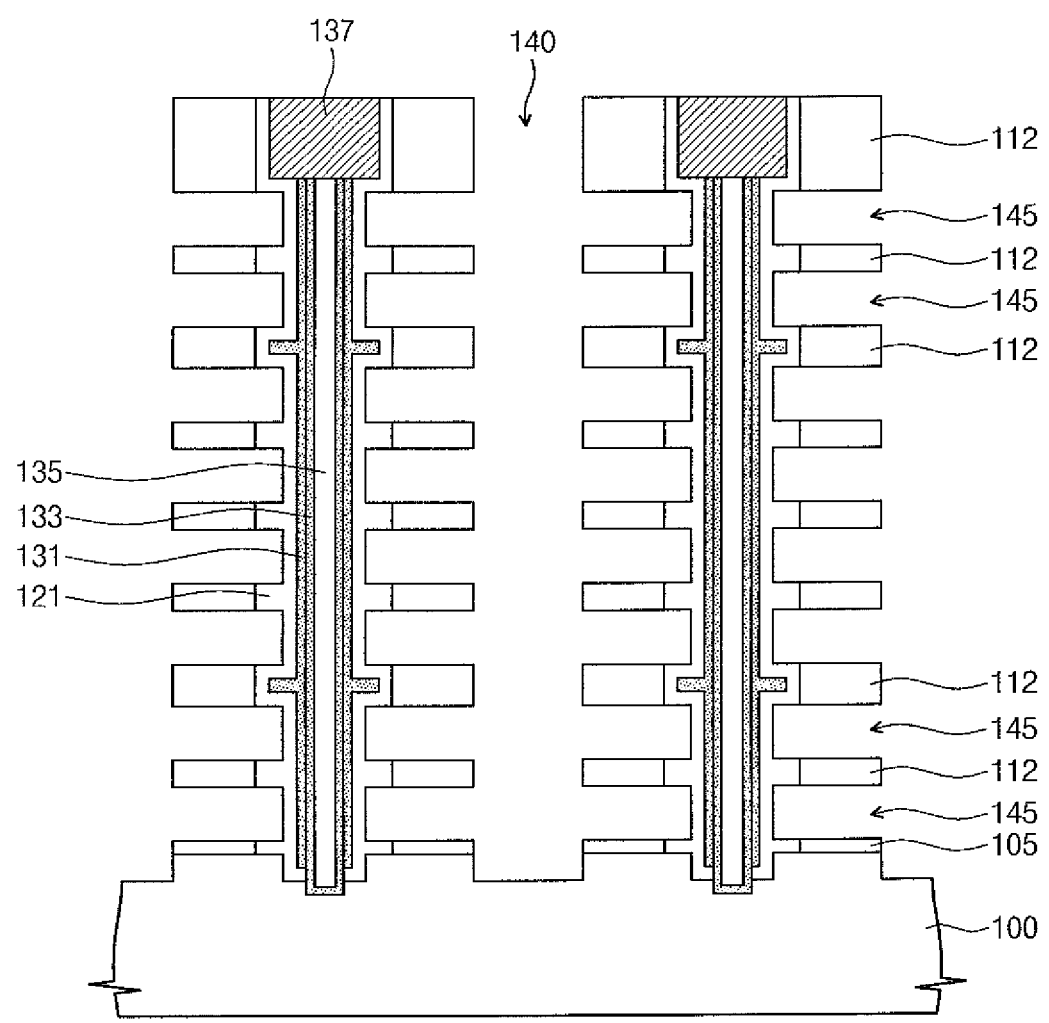

Referring to FIG. 19, the first material layers 111 exposed by the trenches 140 may be removed to form recess regions 145 between the second material layers 112.

The recess regions 145 may be formed by removing the second material layers 112 between the first material layers 111. The recess regions 145 may horizontally extend between the second material layers 112 from the trench 145. The recess regions 145 may expose portions of a sidewall of the vertical insulator 121, respectively. Each of the recess regions 145 may be defined by the second material layers 111 vertically adjacent to each other and the sidewall of the vertical insulator 121.

For example, if the vertical insulator 121 includes the charge storage layer CTL and the tunnel insulating layer TIL, the recess regions 145 may expose portions of the charge storage layer CTL. In an exemplary embodiment of the inventive concept, if the vertical insulator 121 includes the blocking insulating layer BIL, the charge storage layer CTL, and the tunnel insulating layer TIL, the recess regions 145 may expose the blocking insulating layer BIL.

The first material layers 111 may be isotropically etched using an etchant having etch selectivity with respect to the second material layers 112 and the substrate 100, so that the recess regions 145 may be formed. Here, the first material layers 111 may be completely removed by the isotropic etching process. For example, if the first material layers 111 include silicon nitride layers and the second material layers 112 include silicon oxide layers, the isotropic etching process may be performed using an etching solution including phosphoric acid.

In an exemplary embodiment of the inventive concept, since the substrate 100 is formed of a material having an etch selectivity with respect to the first material layers 111 and the second material layers, the substrate 100 is not removed and remains during the formation of the recess regions 145.

Figure 20:
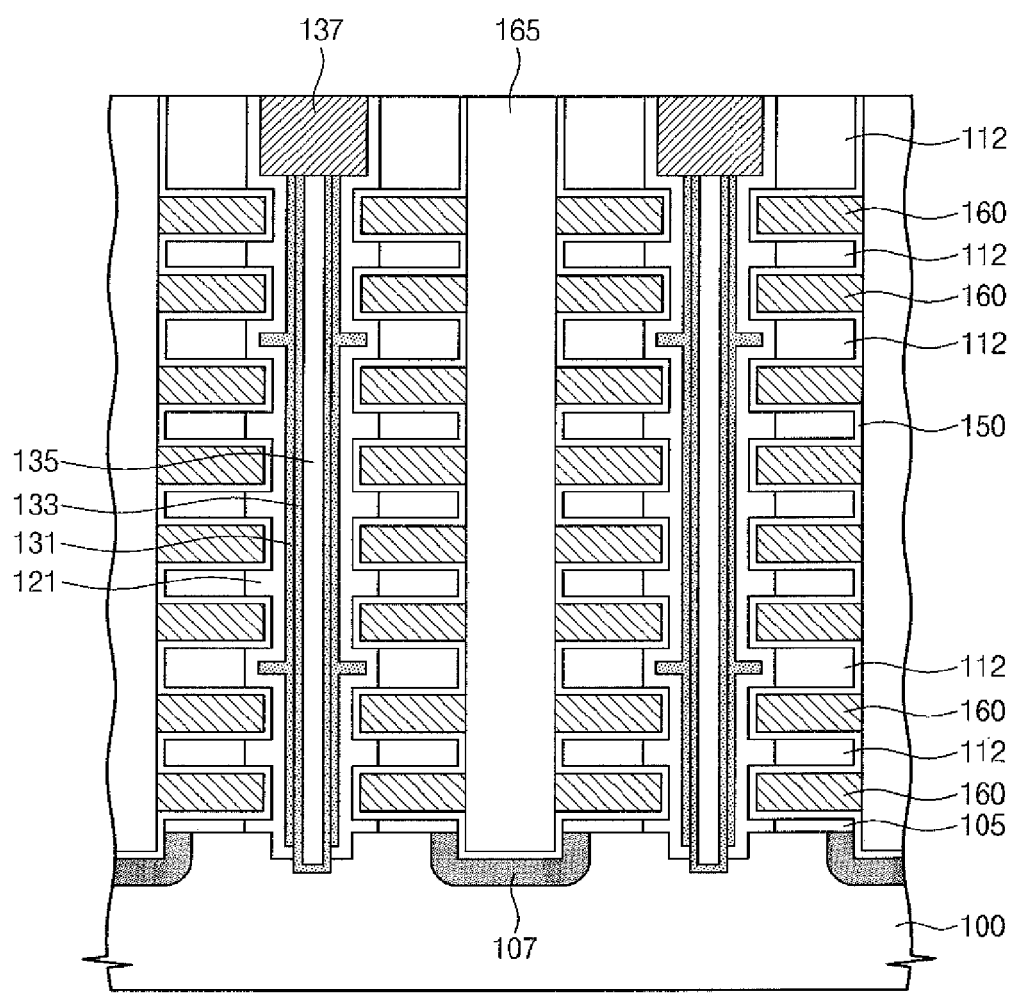

Referring to FIG. 20, a horizontal insulating layer 150 may be formed to cover inner surfaces of the recess regions 145 and then gate patterns 160 may be formed to fill the rest spaces of the recess regions 145. In an exemplary embodiment of the inventive concept, a width of the gate pattern 160 may be greater than a width of each of the patterned second material layers 112 respectively disposed under and on the gate pattern 160.

Forming the horizontal insulating layer 150 and the gate patterns 160 may include forming the horizontal insulating layer 150 and a conductive layer (not shown) sequentially covering the inner surfaces of the recess regions 145, and removing the conductive layer in the trenches 140 to locally form the gate patterns 160 in the recess regions 145.

The horizontal insulating layer 150 may include a single thin layer or a plurality of thin layers. For example, the horizontal insulating layer 150 may include a thin layer of at least a portion of a blocking insulating layer of a charge trap type flash memory transistor. The horizontal insulating layer 150 may conformally cover the inner surface of the recess region 145.

In an exemplary embodiment of the inventive concept, the conductive layer (not shown) may be conformally formed on an inner surface of the trench 140. The conductive layer in the trenches 140 may be etched partially by an isotropic etching process to form the gate patterns 160. In an exemplary embodiment of the inventive concept, the conductive layer may be formed to fill the trenches 140. The conductive layer in the trenches 140 may be anisotropically etched to form the gate patterns 160. The conductive layer may include doped silicon, metals, metal nitrides, and/or metal silicides. For example, the conductive layer may include a metal material such as tantalum nitride and/or tungsten.

In an exemplary embodiment, the gate patterns 160 may be disposed between the recess regions 145 without the horizontal insulating layer 150. As described with reference to FIG. 4, the gate pattern 160 may be directly in contact with the portion of the vertical insulator 121 exposed by the recess region 145.

After the gate patterns 160 are formed, dopant regions 107 may be formed in the substrate 100. The dopant regions 107 may be formed by an ion implantation process. The dopant regions 107 may be formed in the substrate 100 exposed by the trenches 140.

The dopant regions 107 may have a conductivity type different from those of the first and second semiconductor patterns 131 and 133. The dopant region 107 and the substrate 100 may constitute a PN-junction. A portion of the substrate 100, which is in contact with the second semiconductor pattern 133, may have the same conductivity type as the second semiconductor pattern 133.

In an exemplary embodiment of the inventive concept, the dopant regions 107 may be connected to each other and may be in an equipotential state. In an exemplary embodiment of the inventive concept, the dopants regions 107 may be electrically separated from each other and may be controlled independently from each other. In an exemplary embodiment of the inventive concept, the dopant regions 107 may constitute a plurality of source groups. Each of the source groups may include a plurality of the dopant regions 107. The source groups may be electrically separated from each other and may be controlled independently from each other.

Referring to FIG. 20, electrode-separation patterns 165 may be formed to fill the trenches 140. The electrode-separation pattern 165 may include a silicon oxide layer, a silicon nitride layer, or a silicon oxynitride layer.

Contact plugs 171 and a bit line 175 as shown in FIG. 2 may be formed on the structure of FIG. 20. The contact plugs 171 may be connected to the conductive pads 137. The bit line may be connected to the contact plugs 171. The contact plugs 171 may include doped silicon and/or metallic materials. The bit line 175 may be electrically connected to the first and second semiconductor patterns 131 and 133 through the contact plug 171. The bit line 175 may cross over the gate patterns 160 and/or the trenches 140.

FIGS. 21 to 26 are cross-sectional views a method of fabricating a three dimensional semiconductor memory device according to an exemplary embodiment of the inventive concept. The descriptions of the same elements as in the above embodiments will be omitted or mentioned briefly for the purpose of ease and convenience in explanation.

Figure 21:
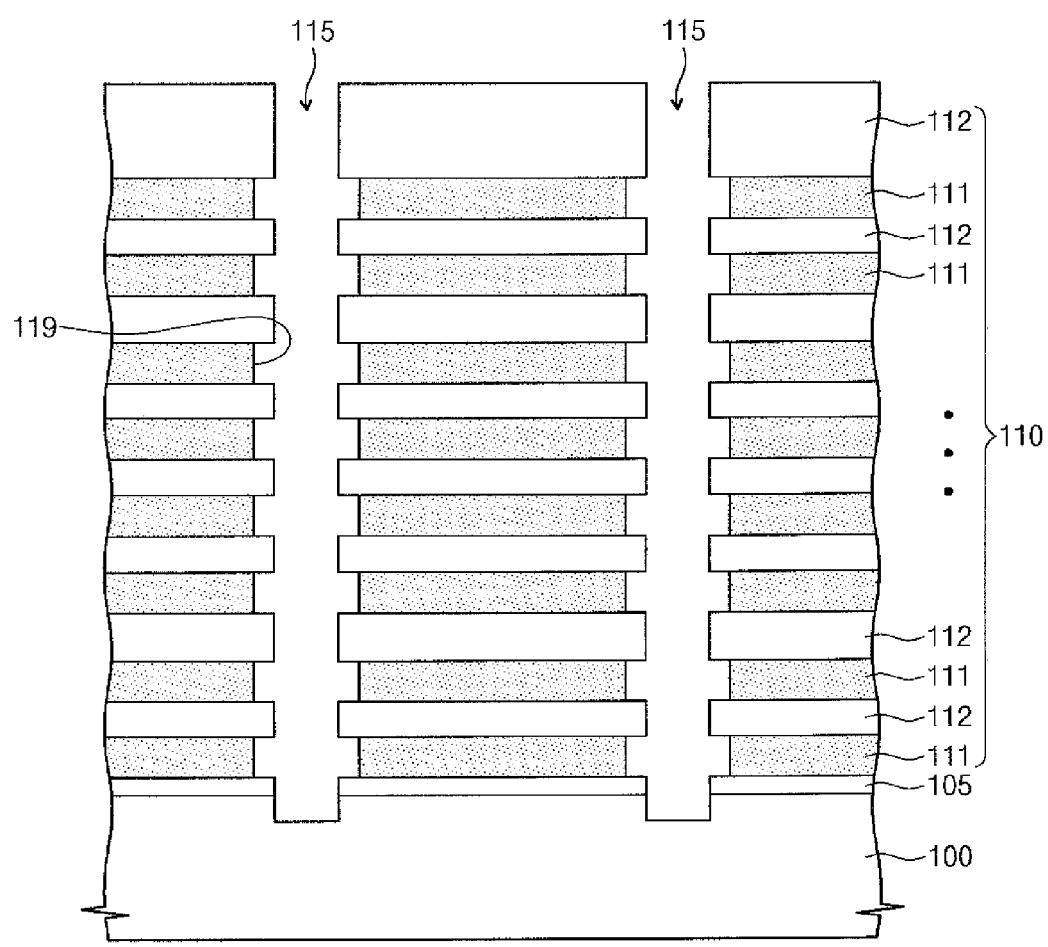
FIGS. 21 to 26 are cross-sectional views a method of fabricating a 3D semiconductor memory device according to an exemplary embodiment of the inventive concept.

Referring to FIG. 21, after openings 115 are formed to penetrate the thin layer-structure 110, portions of the first material layers 111 exposed of the opening 115 may be removed to form enlarged regions 119. In an exemplary embodiment of the inventive concept, the portions of the first material layers 111 may be isotropically etched using an etchant having etch selectivity with respect to the second material layers 112 and the substrate 100 to form the enlarged regions 119. Since the portions of the first material layers 111 are removed partially, the enlarged regions 119 may be formed between the second material layers 112.

Figure 22:
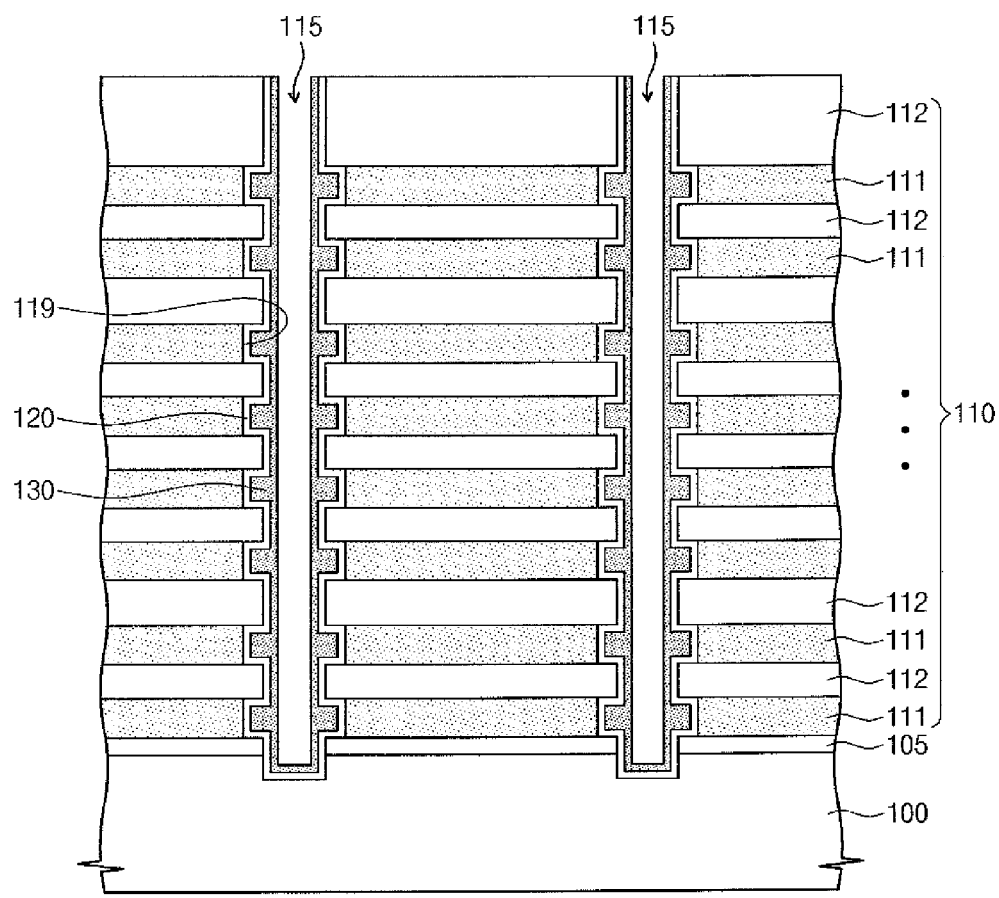

Referring to FIG. 22, a vertical insulating layer 120 and a first semiconductor layer 130 may be sequentially formed to cover an inner sidewall of the opening 115 which has the enlarged regions 119.

The vertical insulating layer 120 and the first semiconductor layer 130 may partially fill the opening 115. The vertical insulating layer 120 may be deposited to conformally cover the inner sidewall of the opening 115 having the enlarged regions 119. The vertical insulating layer 120 may include a charge storage layer CTL and a tunnel insulating layer TIL. For example, the charge storage layer CTL may be deposited on a sidewall of the first material layer 111 and top and bottom surfaces of the second material layers 112 with a substantially uniform thickness. As a result, the charge storage layer CTL may define an empty space in the enlarged region 119. The tunnel insulating layer TIL may be conformally formed on the charge storage layer CTL or fill the empty space defined by the charged storage layer CTL.

Figure 23:
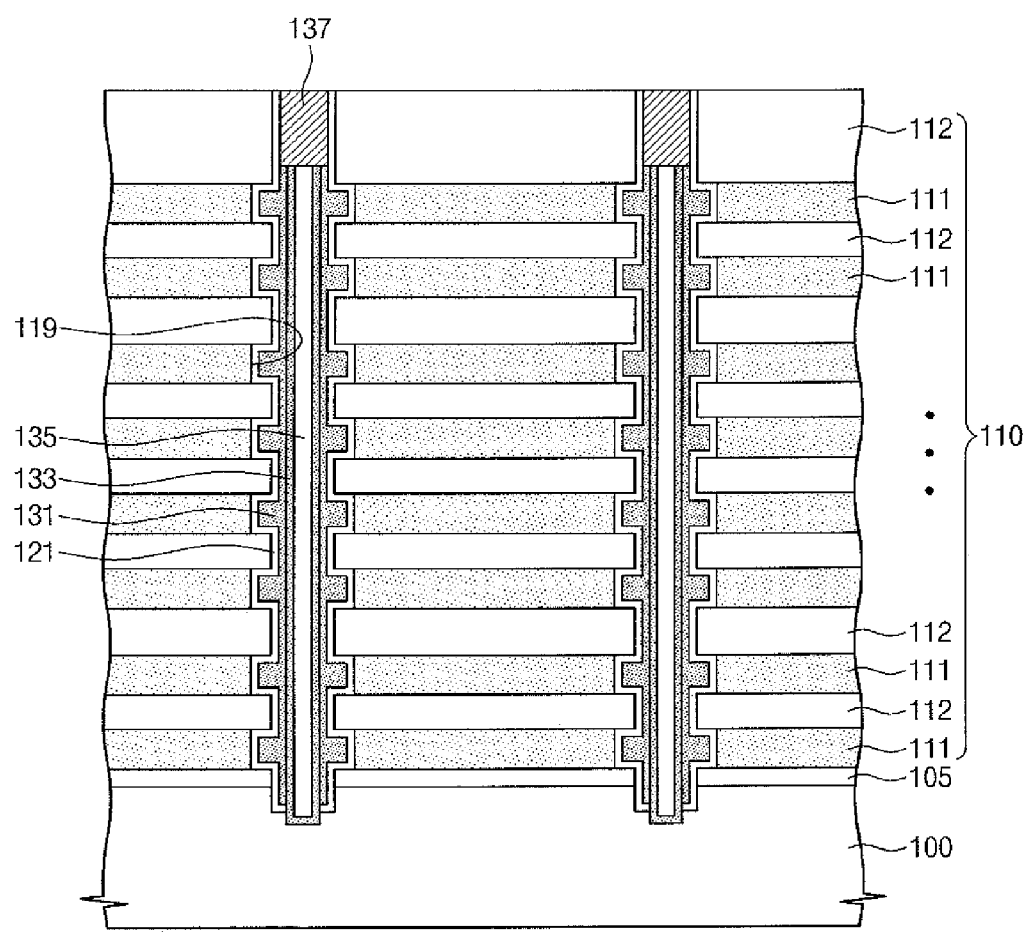

Referring to FIG. 23, the first semiconductor layer 130 and the vertical insulating layer 120 on a bottom of the openings 115 may be etched to form a vertical insulator 121 and a first semiconductor pattern 131 in each of the openings 115. The second semiconductor pattern 133, the filling insulating pattern, and the conductive pad 137 may be formed in the opening 115 having the first semiconductor pattern 131 and the vertical insulator 121 using a method like that described above with respect to FIGS. 12 to 20.

Figure 24:
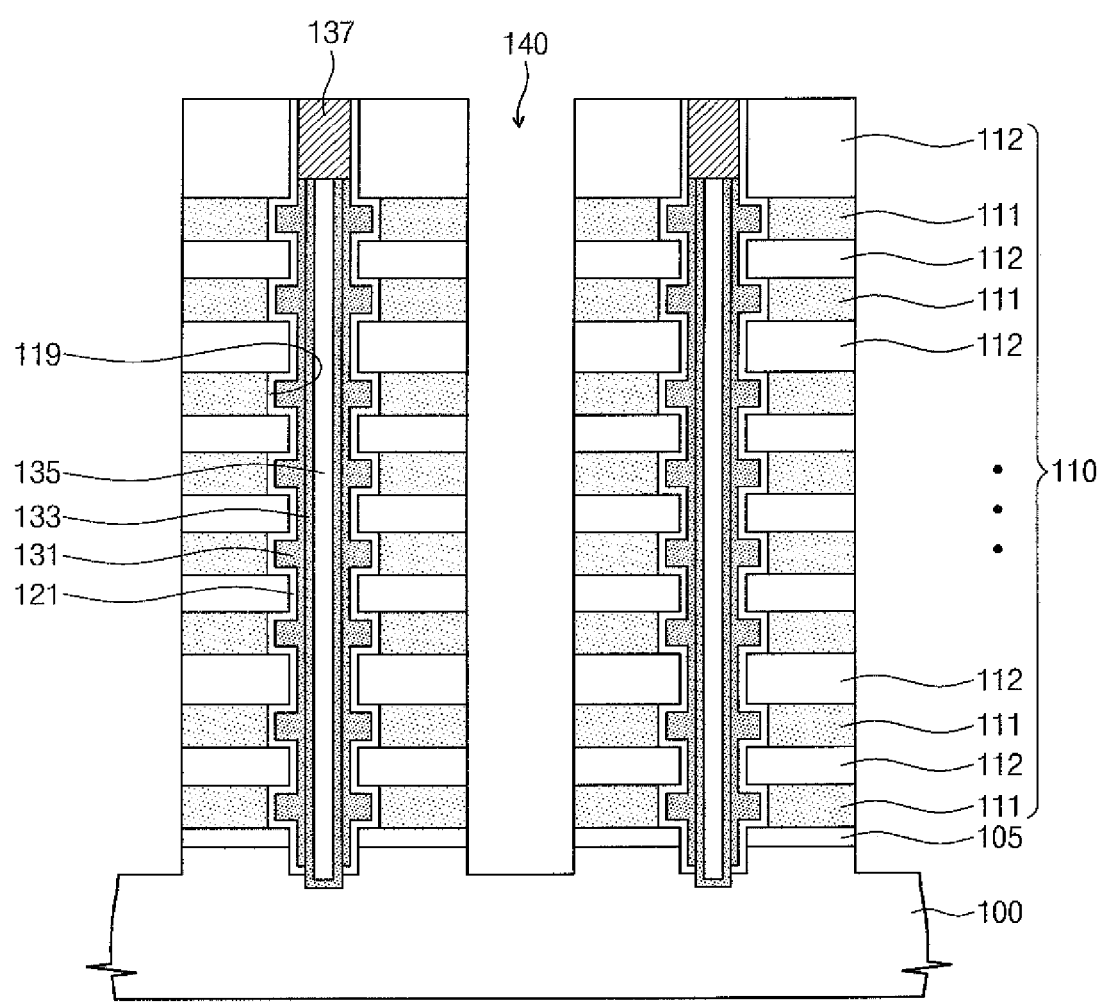

Referring to FIG. 24, the thin-layered structure 110 may be patterned to form trenches 140 exposing the substrate 100 between the openings 115. The trenches 140 may have a line-shape or a rectangular shape in a plan view.

Figure 25:
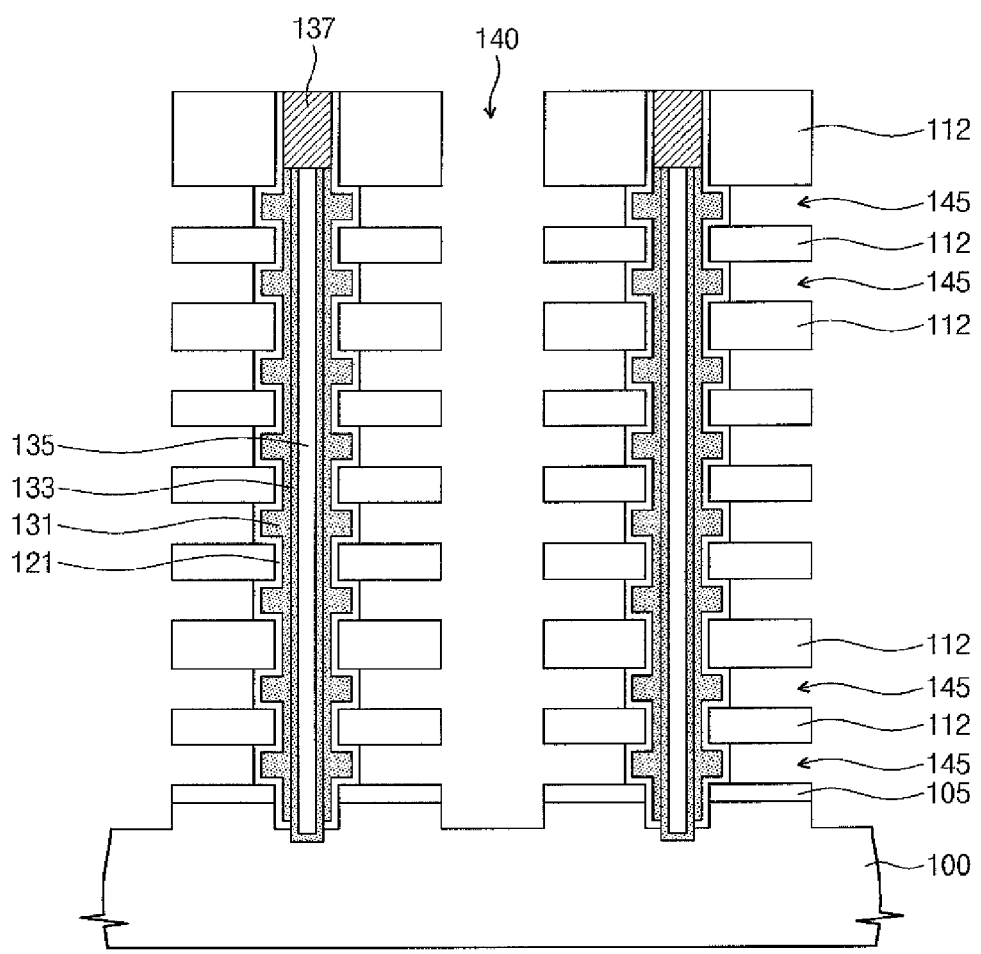

Referring to FIG. 25, the first material layers 111 exposed by the trenches 140 may be removed to form recess regions 145 between the second material layers 112.

The first material layers 111 may be isotropically etched using an etchant having etch selectivity with the second material layers 112 and the substrate 100 to form the recess regions 145. The recess regions 145 may expose portions of the vertical insulator 121. The lateral recess depth of the recess region 145 according to an exemplary embodiment of the inventive concept may be smaller than that of the recess region 145 of the embodiment illustrated in FIG. 19.

Figure 26:
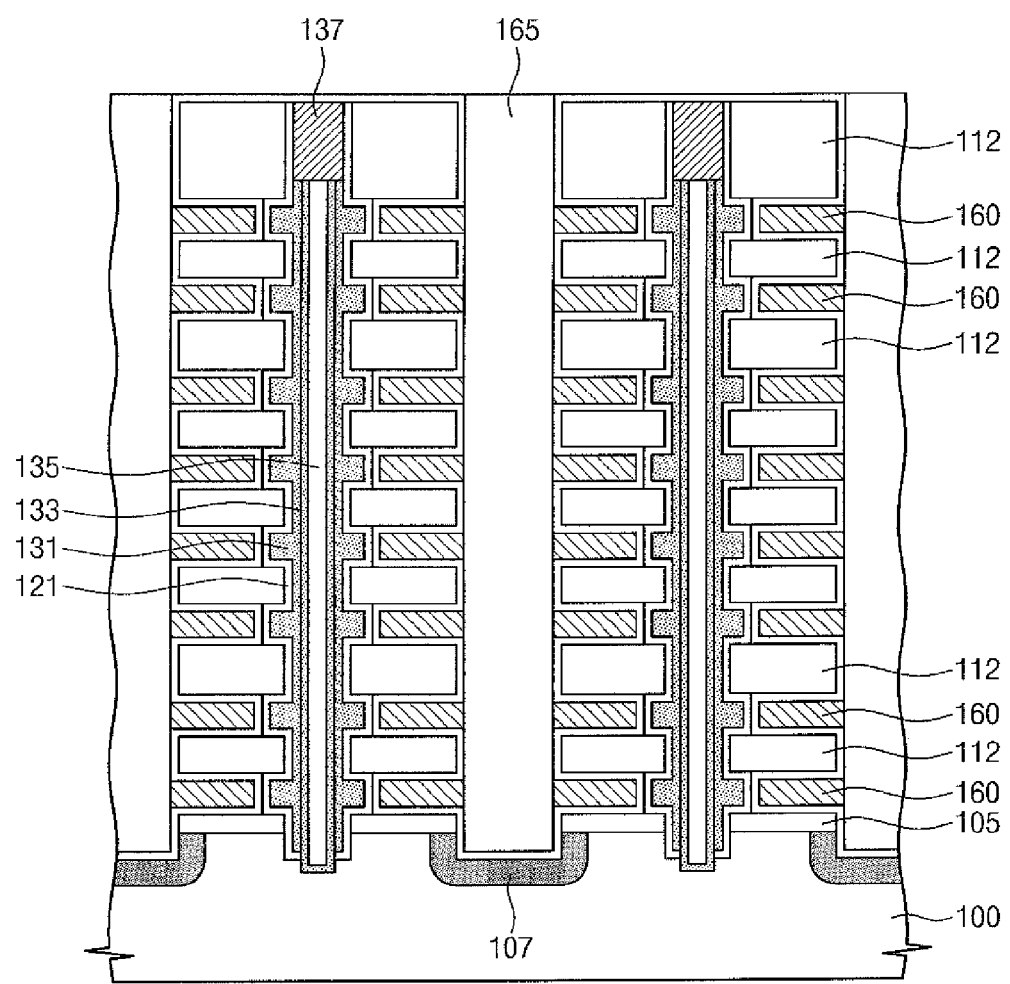

Referring to FIG. 26, a horizontal insulating layer 150 and gate patterns 160 may be formed in the recess regions 145. A width of the gate pattern 160 may be smaller than a width of the patterned second material layer 112.

After the gate patterns 160 are formed, electrode-separation patterns 165 may be formed in the trenches 140. As shown in FIG. 6, the bit line 175 may be formed over the first and second semiconductor patterns 131 and 133.

Figure 27:
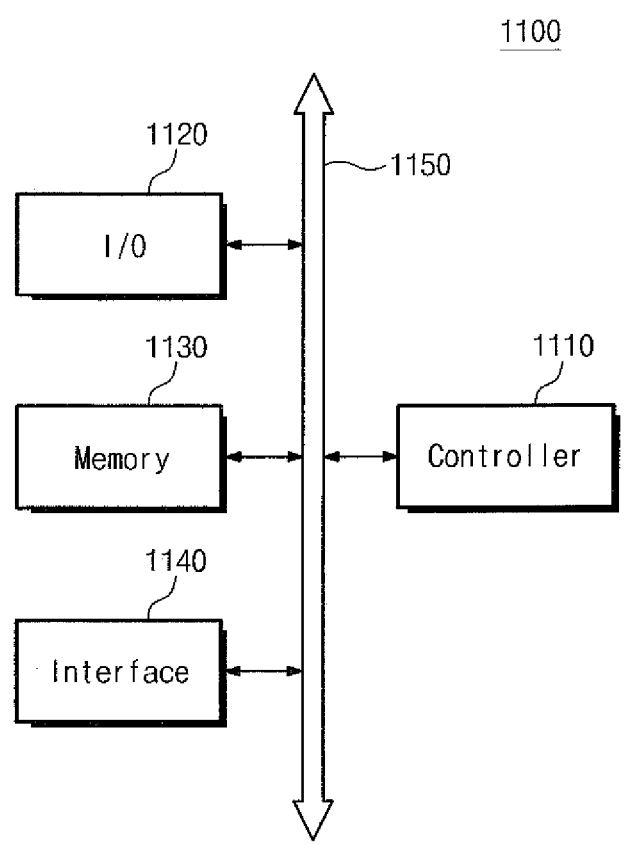
FIG. 27 is a schematic block diagram illustrating an example of memory systems including 3D semiconductor memory devices according to an exemplary embodiment of the inventive concept.

FIG. 27 is a schematic block diagram illustrating an example of memory systems including 3D semiconductor memory devices according to an exemplary embodiment of the inventive concept.

Referring to FIG. 27, a memory system 1100 may be applied to a personal digital assistant (PDA), a portable computer, a web tablet, a wireless phone, a mobile phone, a digital music player, a memory card, or other electronic products. The other electronic products may receive or transmit information data by wireless.

The memory system 1100 may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150.

The controller 1110 may include a microprocessor, a digital signal processor, a microcontroller or other logic devices. The other logic devices may have a similar function to any one of the microprocessor, the digital signal processor and the microcontroller. The I/O unit 1120 may receive data or signal from the outside of the system 110 or transmit data or signal to the outside of the system 1100. For example, the I/O unit 1120 may include a keypad, a keyboard and/or a display unit.

The memory device 1130 includes at least one of the three dimensional semiconductor memory devices according to an exemplary embodiment of the inventive concept. The memory device 1130 may further include volatile memory devices capable of randomly accessing or various kinds of non-volatile memory devices.

The interface unit 1140 may transmit data to a communication network or receive data from the communication network.

The three dimensional semiconductor memory devices according to an embodiment of the inventive concept may be encapsulated using various packaging techniques. For example, a three dimensional semiconductor memory devices manufactured according to an exemplary embodiment of the inventive concept may be encapsulated using a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique or a wafer-level processed stack package (WSP) technique.

Figure 28:
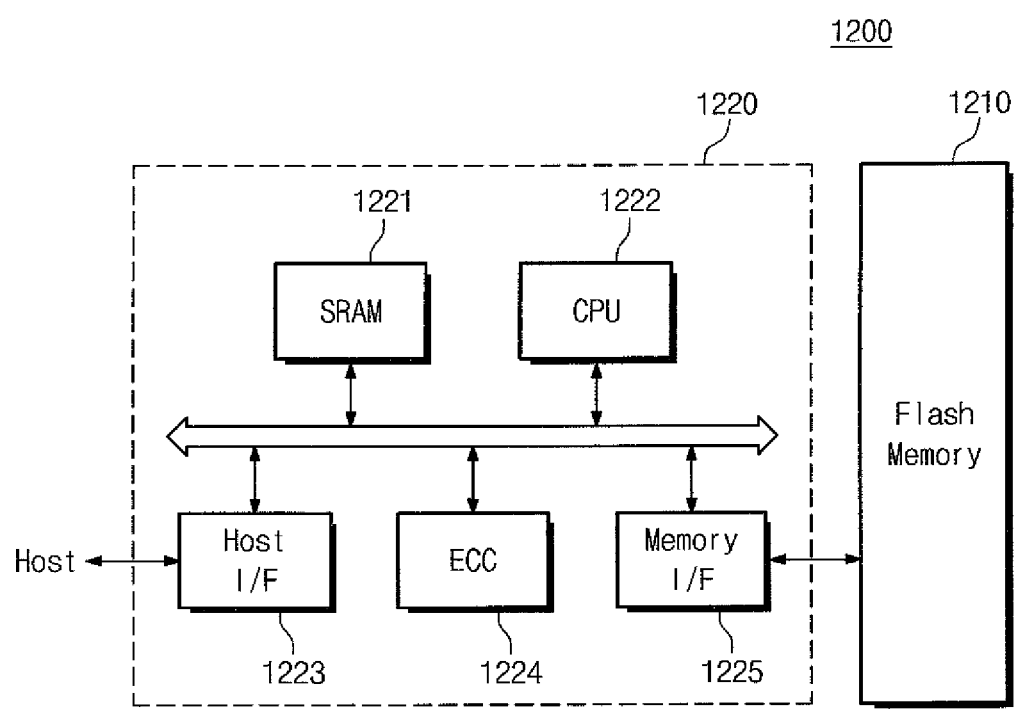
FIG. 28 is a schematic block diagram illustrating an example of memory cards including 3D semiconductor memory devices according to an exemplary embodiment of the inventive concept.

FIG. 28 is a schematic block diagram illustrating an example of memory cards including three dimensional semiconductor memory devices according to an exemplary embodiment of the inventive concept.

Referring to FIG. 28, a memory card 1200 for storing massive data may include a flash memory device 1210. The flash memory device 1210 includes at least one of the three dimensional semiconductor memory devices according to an exemplary embodiment of the inventive concept. The memory card 1200 may include a memory controller 1220 that controls data communication between a host and the flash memory device 1210.

An SRAM device 1221 may be used as an operation memory of a central processing unit (CPU) 1222. A host interface unit 1223 may be configured to include a data communication protocol of a host connected to the memory card 1200. An error check and correction (ECC) block 1224 may detect and correct errors of data which are read out from the memory device 1210. A memory interface unit 1225 may interface with the flash memory device 1210 according to an exemplary embodiment of the inventive concept. The CPU 1222 may perform overall operations for data exchange of the memory controller 1220. Even though not shown in the drawings, the memory card 1200 may further include a read only memory (ROM) device that stores code data to interface with the host.

Figure 29:
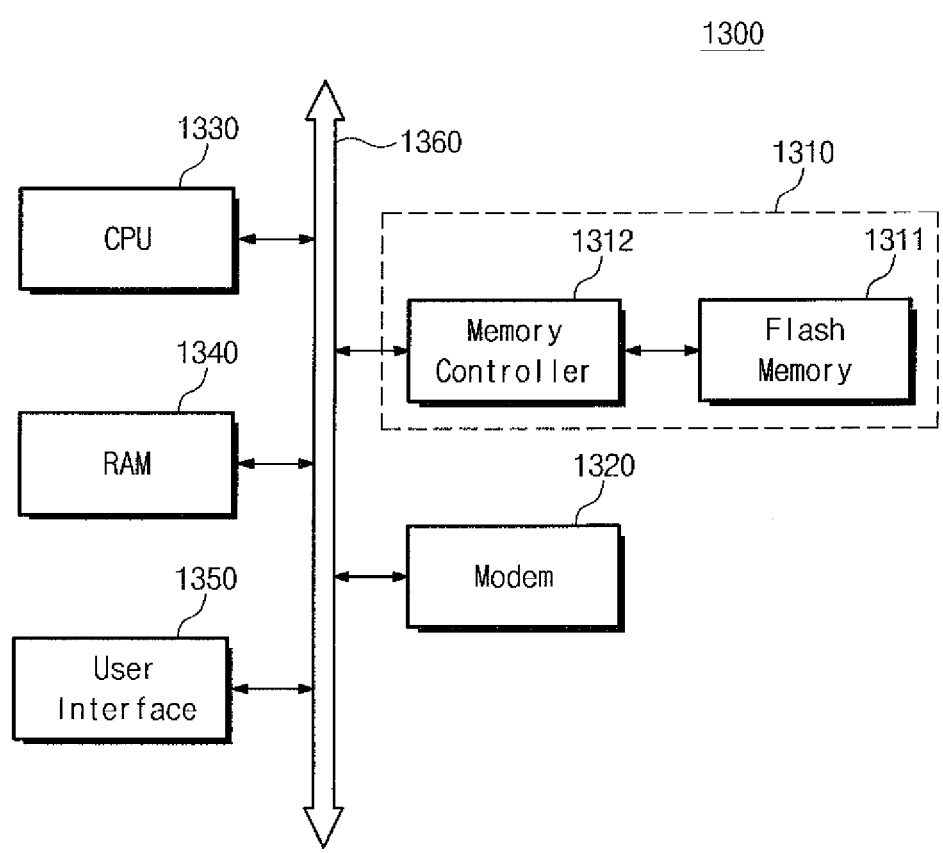
FIG. 29 is a schematic block diagram illustrating an example of information processing systems including 3D semiconductor memory devices according to an exemplary embodiment of the inventive concept.

FIG. 29 is a schematic block diagram illustrating an example of information processing systems including three dimensional semiconductor memory devices according to embodiments of the inventive concept.

Referring to FIG. 29, an information processing system 1300 such as a mobile device or a desk top computer may include a flash memory system 1310. The flash memory system 1310 may include a memory controller 1312 and a flash memory device 1311. The flash memory device 1311 includes at least one of the three dimensional semiconductor memory devices according to an exemplary embodiment of the inventive concept. The information processing system 1300 may include a MODEM 1320, a central processing unit (CPU) 1330, a RAM 1340, a user interface unit 1350 that are electrically connected to the flash memory system 1310 through a system bus 1360. The flash memory system 1310 may be substantially the same as the aforementioned memory system or flash memory system. Data processed by the CPU 1330 or data inputted from an external system may be stored in the flash memory system 1310. The flash memory system 1310 may include a solid state disk (SSD). In this case, the information processing system 1300 may stably store massive data in the flash memory system 1310. Such data stability of the flash memory system 1310 may reduce a resource for correcting errors to provide a high speed data exchange function to the information processing system 1300. The information processing system 1300 according to an exemplary embodiment of the inventive concept may further include an application chipset, a camera image processor (CIS), and/or an input/output unit.

According to exemplary embodiments of the inventive concept, the charge storage layer may vertically cross one sidewalls of the gate patterns vertically stacked on the substrate, and the charge storage layer may windingly formed. Thus, it is possible to suppress vertical spread of charges trapped in the charge storage layer. As a result, a loss of charges stored in the date storage layer may be reduced, such that charge retention characteristic of the 3D semiconductor memory device may be improved. Thus, three dimensional semiconductor memory devices according to an exemplary embodiment of the inventive concept may have increased reliability.

While the present inventive concept has been shown and described with reference to exemplary embodiments thereof, it will be apparent to those of ordinary skill in the art that various changes in form and detail may be made therein without departing from the sprit and scope of the inventive concept.

What is claimed is:

1. A three-dimensional (3D) semiconductor memory device comprising:
    a stack structure including a plurality of gate patterns and a plurality of insulating patterns which are stacked alternately and vertically on a substrate, the stack structure having a sidewall including a plurality of enlarged regions recessed laterally;
    a channel structure having a first sidewall adjacent to the sidewall of the stack structure and connected to the substrate; and
    a data storage layer disposed between the stack structure and the channel structure and covering the sidewall of the stack structure,
    wherein the plurality of enlarged regions are each defined by two insulating patterns of the plurality of insulating patterns and a gate pattern of the plurality of gate patterns, the two insulating patterns being vertically adjacent to each other and the gate pattern being disposed between the two insulating layers, and
    wherein the channel structure has a second sidewall adjacent to the plurality of enlarged regions, wherein the second sidewall is vertically in parallel to the first sidewall, wherein the second sidewall is vertically flat with no protrusions toward the stack structure.

2. The 3D semiconductor memory device of claim 1, further comprising a horizontal insulating layer disposed between the plurality of gate patterns and the plurality of insulation patterns and disposed between the plurality of gate patterns and the data storage layer.

3. The 3D semiconductor memory device of claim 1, wherein the data storage layer includes a charge storage layer and a tunnel insulating layer which are sequentially stacked; and
    wherein a thickness of the charge storage layer is less than half of a thickness of the insulating pattern or the gate pattern.

4. The 3D semiconductor memory device of claim 3, wherein the data storage layer further includes a blocking insulating layer disposed between the stack structure and the charge storage layer; and
    wherein a combined thickness of the blocking insulating layer and the charge storage layer is less than half of a thickness of at least one of the insulating pattern and the gate pattern.

5. The 3D semiconductor memory device of claim 1, wherein the channel structure comprises:
    a first semiconductor pattern covering a sidewall of the data storage layer; and
    a second semiconductor pattern covering a sidewall of the first semiconductor pattern, wherein the second semiconductor pattern is directly in contact with the substrate.

6. The 3D semiconductor memory device of claim 5, wherein the data storage layer is further disposed between the substrate and a bottom surface of the first semiconductor pattern and is directly in contact with the second semiconductor pattern.

7. A three-dimensional (3D) semiconductor memory device comprising:
- an electrode separation pattern disposed on a substrate;
- a stack structure disposed on a sidewall of the electrode separation pattern, wherein the stack structure includes a plurality of gate patterns and a plurality of insulating patterns stacked alternately and vertically on the substrate, and the stack structure has a corrugated sidewall opposite to the sidewall of the electrode separation pattern;
- a data storage layer disposed on the corrugated sidewall; and
- a channel structure disposed on the data storage layer,
- wherein the sidewall of the electrode separation pattern is oriented vertically with respect to the substrate,
- wherein each of the plurality of gate patterns has a first width and each of the plurality of insulating patterns has a second width greater than the first width, wherein the first and second widths are measured from the sidewall of the electrode separation pattern,
- wherein the data storage layer includes a charge storage layer and a tunnel insulating layer which are sequentially stacked.

8. The 3D semiconductor memory device of claim 7, wherein the data storage layer further comprises a blocking insulating layer disposed between the corrugated sidewall and the charge storage layer.

9. The 3D semiconductor memory device of claim 7, wherein the channel structure comprises:
- a first semiconductor pattern disposed on a sidewall of the data storage layer; and
- a second semiconductor pattern disposed on the first semiconductor pattern and being directly in contact with the substrate.

10. A three-dimensional (3D) semiconductor memory device comprising:
- a stack structure including a plurality of gate patterns and a plurality of insulating patterns which are stacked alternately and vertically on a substrate, the stack structure having sidewall including a plurality of enlarged regions recessed laterally;
- a channel structure having a first sidewall adjacent to the sidewall of the stack structure and connected to the substrate; and
- a data storage layer disposed between the stack structure and the channel structure and covering the sidewall of the stack structure,
- wherein a width of each of the plurality of gate patterns is less than that of each of the plurality of insulating patterns, and the plurality of enlarged regions are each defined by two insulating patterns of the plurality of insulating patterns and a gate pattern of the plurality of gate patterns, the two insulating patterns being vertically adjacent to each other and the gate pattern being disposed between the two insulating layers,
- wherein the channel structure has a second sidewall adjacent to the plurality of enlarged regions, wherein the second sidewall is vertically in parallel to the first sidewall, wherein the second sidewall is vertically flat with no protrusions toward the stack structure.

* * * * *